(12) United States Patent
Suk et al.

(10) Patent No.: US 10,930,625 B2
(45) Date of Patent: Feb. 23, 2021

(54) SEMICONDUCTOR PACKAGE AND METHOD OF FABRICATING THE SAME

(71) Applicant: Samsung Electronics Co., Ltd., Suwon-si (KR)

(72) Inventors: Kyoung Lim Suk, Suwon-si (KR); Seokhyun Lee, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/430,426

(22) Filed: Jun. 4, 2019

(65) Prior Publication Data

US 2020/0083201 A1    Mar. 12, 2020

(30) Foreign Application Priority Data

Sep. 7, 2018  (KR) .................. 10-2018-0107124

(51) Int. Cl.
| | | |
|---|---|---|
| *H01L 25/10* | (2006.01) | |
| *H01L 23/522* | (2006.01) | |
| *H01L 23/528* | (2006.01) | |
| *H01L 23/31* | (2006.01) | |
| *H01L 21/56* | (2006.01) | |
| *H01L 23/00* | (2006.01) | |

(52) U.S. Cl.
CPC .......... *H01L 25/105* (2013.01); *H01L 21/565* (2013.01); *H01L 23/3128* (2013.01); *H01L 23/5226* (2013.01); *H01L 23/5283* (2013.01); *H01L 24/09* (2013.01); *H01L 24/17* (2013.01); *H01L 2224/0231* (2013.01); *H01L 2224/02373* (2013.01); *H01L 2224/02381* (2013.01); *H01L 2225/1058* (2013.01)

(58) Field of Classification Search
None
See application file for complete search history.

(56) References Cited

U.S. PATENT DOCUMENTS

| | | | |
|---|---|---|---|
| 8,026,608 B2 * | 9/2011 | Sabatini | .............. H01L 24/82 257/758 |
| 8,900,989 B2 | 12/2014 | Tsai et al. | |
| 9,343,400 B2 | 5/2016 | Lee et al. | |
| 9,373,564 B2 | 6/2016 | Shen et al. | |
| 9,607,946 B2 | 3/2017 | Chou et al. | |
| 9,865,810 B2 | 1/2018 | Park | |

(Continued)

FOREIGN PATENT DOCUMENTS

| | | |
|---|---|---|
| KR | 10-0997786 B1 | 12/2010 |
| KR | 10-1128705 B1 | 3/2012 |

*Primary Examiner* — Angel Roman
(74) *Attorney, Agent, or Firm* — Muir Patent Law, PLLC

(57) ABSTRACT

A method of fabricating a semiconductor package includes providing a semiconductor chip, forming a redistribution substrate, and fabricating a package including the semiconductor chip disposed on the redistribution substrate. The forming of the redistribution substrate may include forming a first insulating layer on a substrate, the first insulating layer having a first opening formed therein, forming an integrally formed first redistribution pattern in the first opening and on the first insulating layer, forming a second insulating layer on the first insulating layer to cover the first redistribution pattern, and performing a planarization process on the second insulating layer to expose the first redistribution pattern.

19 Claims, 43 Drawing Sheets

(56) References Cited

U.S. PATENT DOCUMENTS

| | | | |
|---|---|---|---|
| 2016/0056055 A1* | 2/2016 | Ko | H01L 23/3114 |
| | | | 438/107 |
| 2016/0163564 A1* | 6/2016 | Yu | H01L 23/5386 |
| | | | 257/774 |
| 2018/0053708 A1 | 2/2018 | Shih | |
| 2018/0301396 A1* | 10/2018 | Pan | H01L 23/5222 |

* cited by examiner

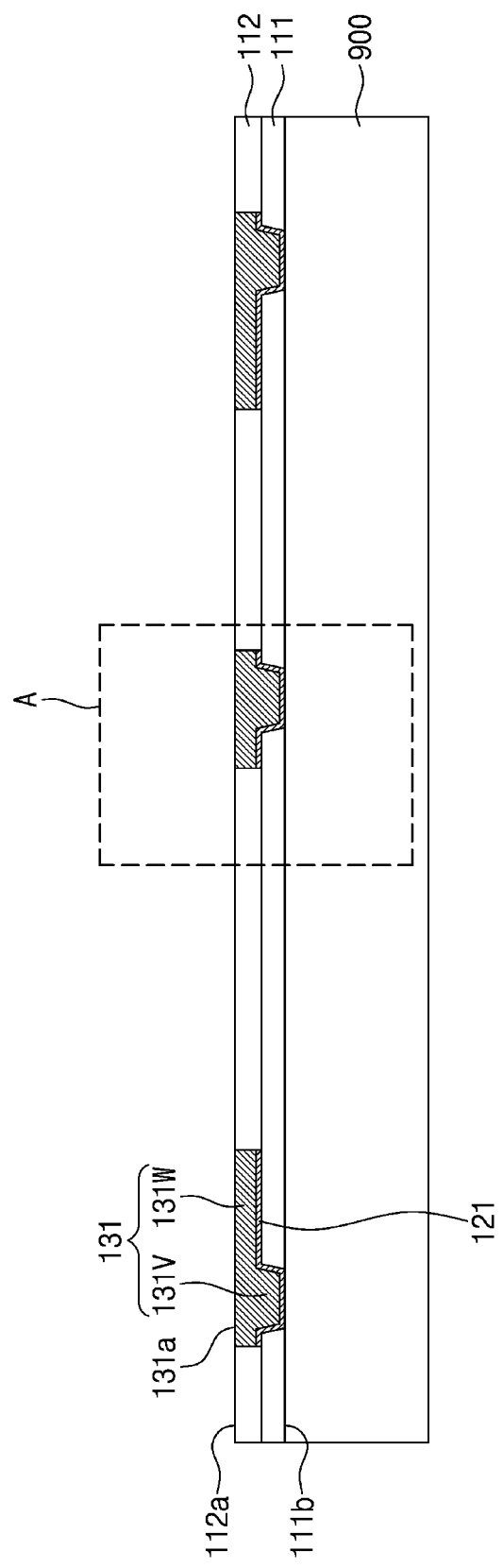

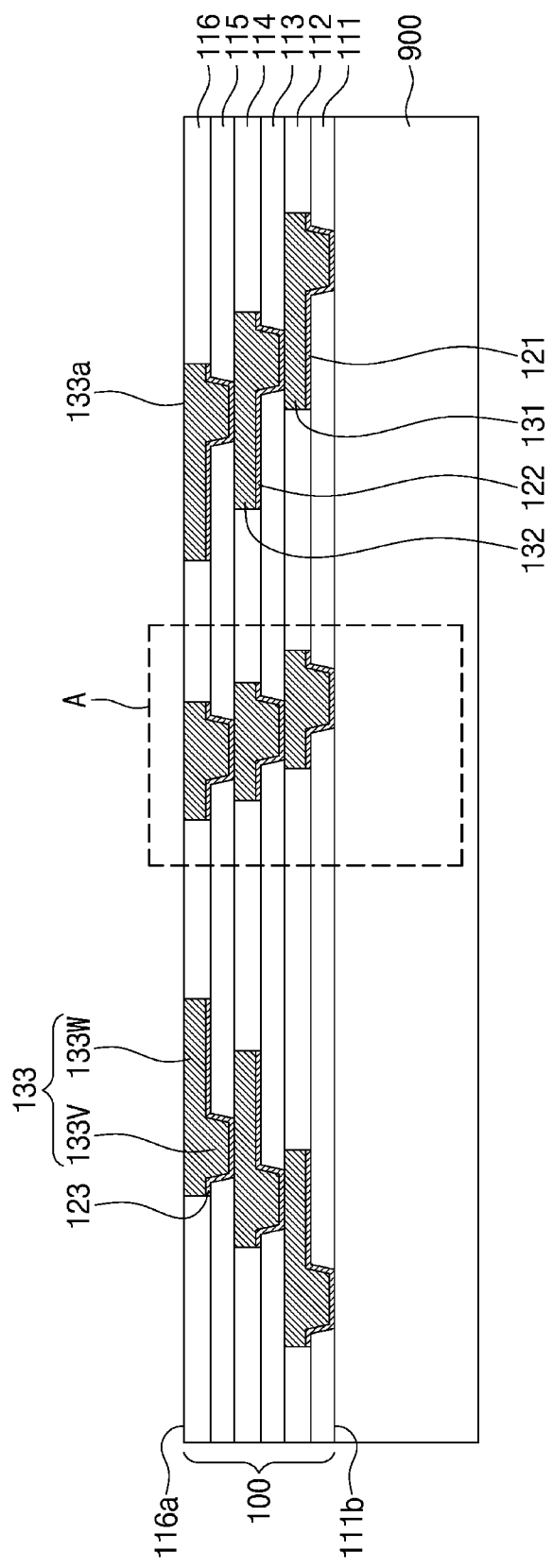

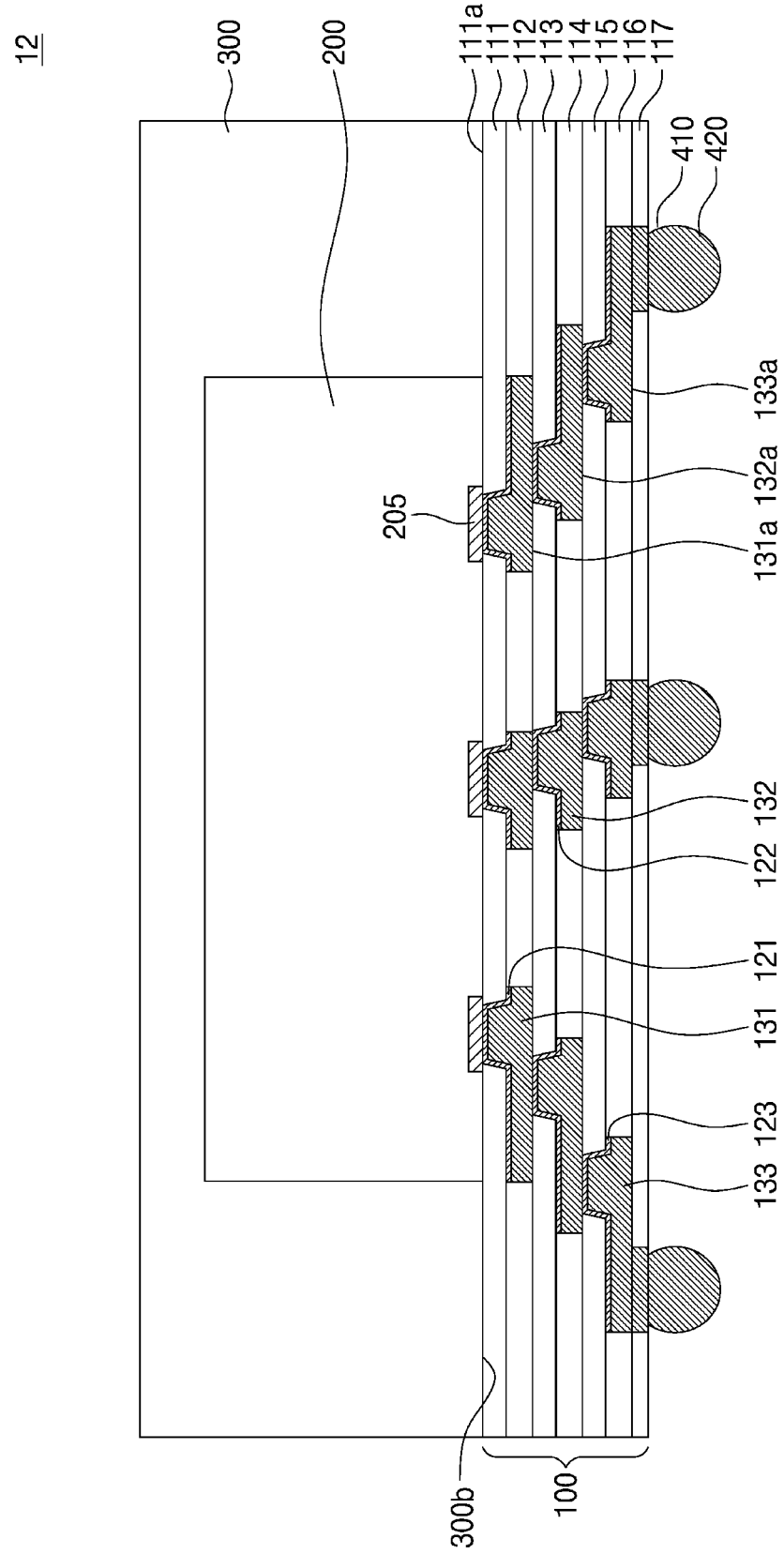

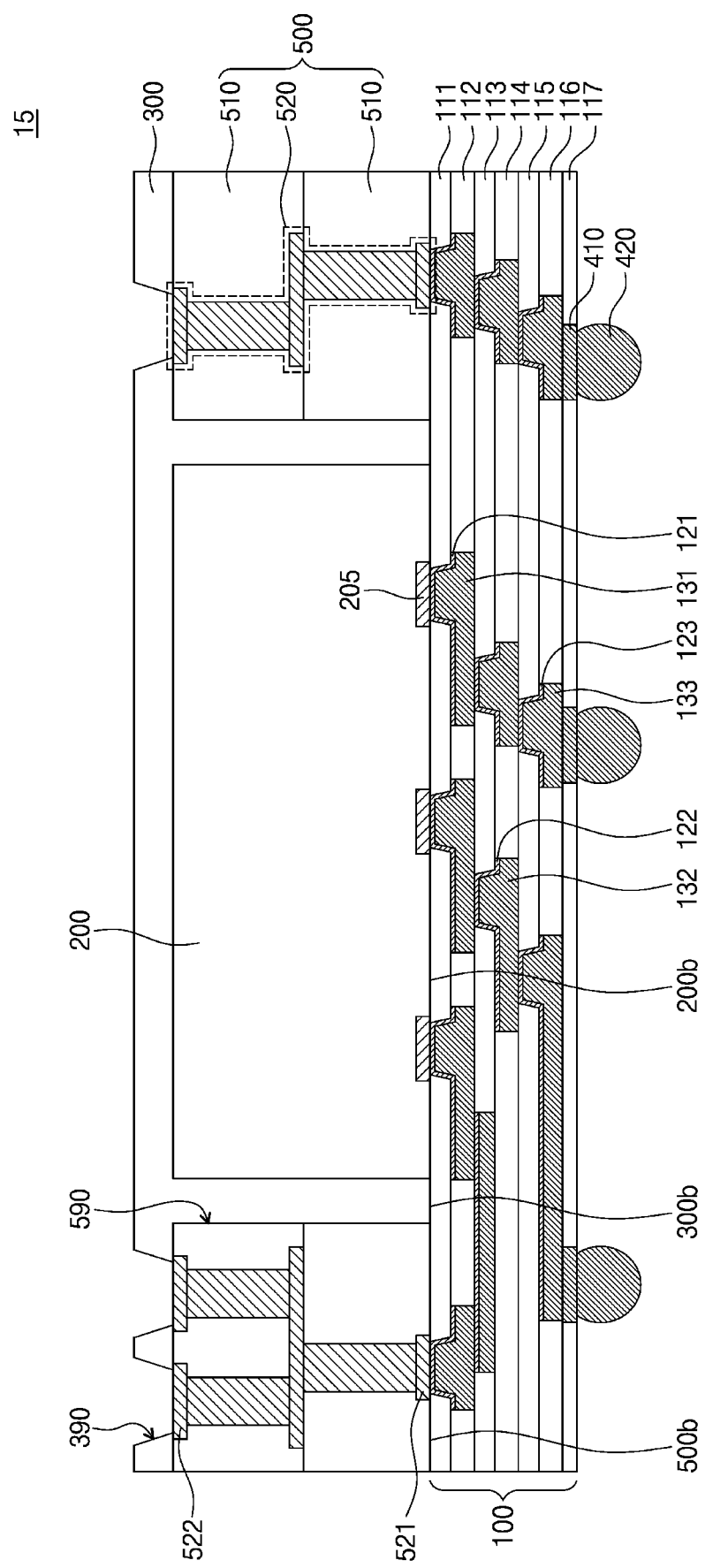

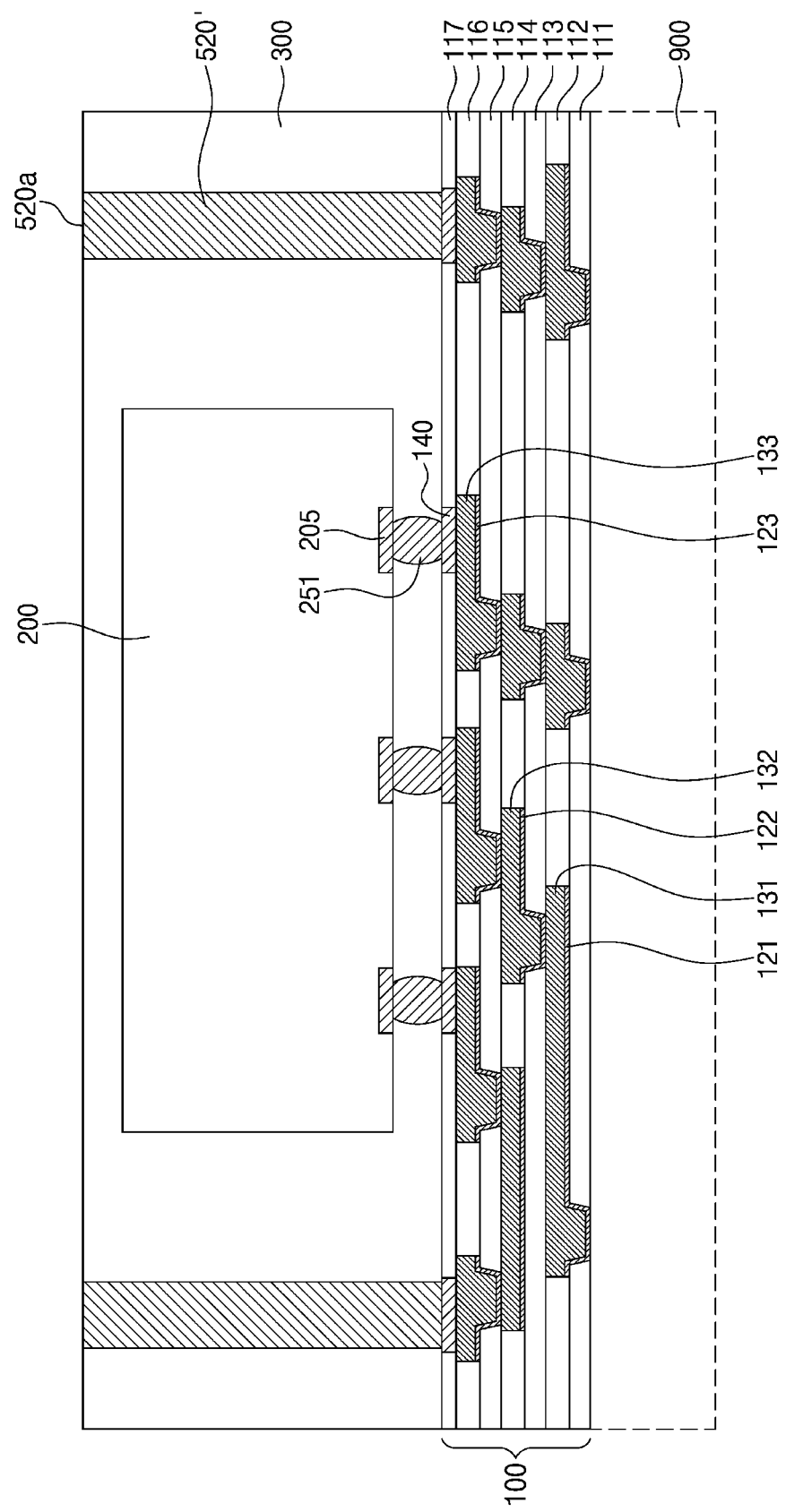

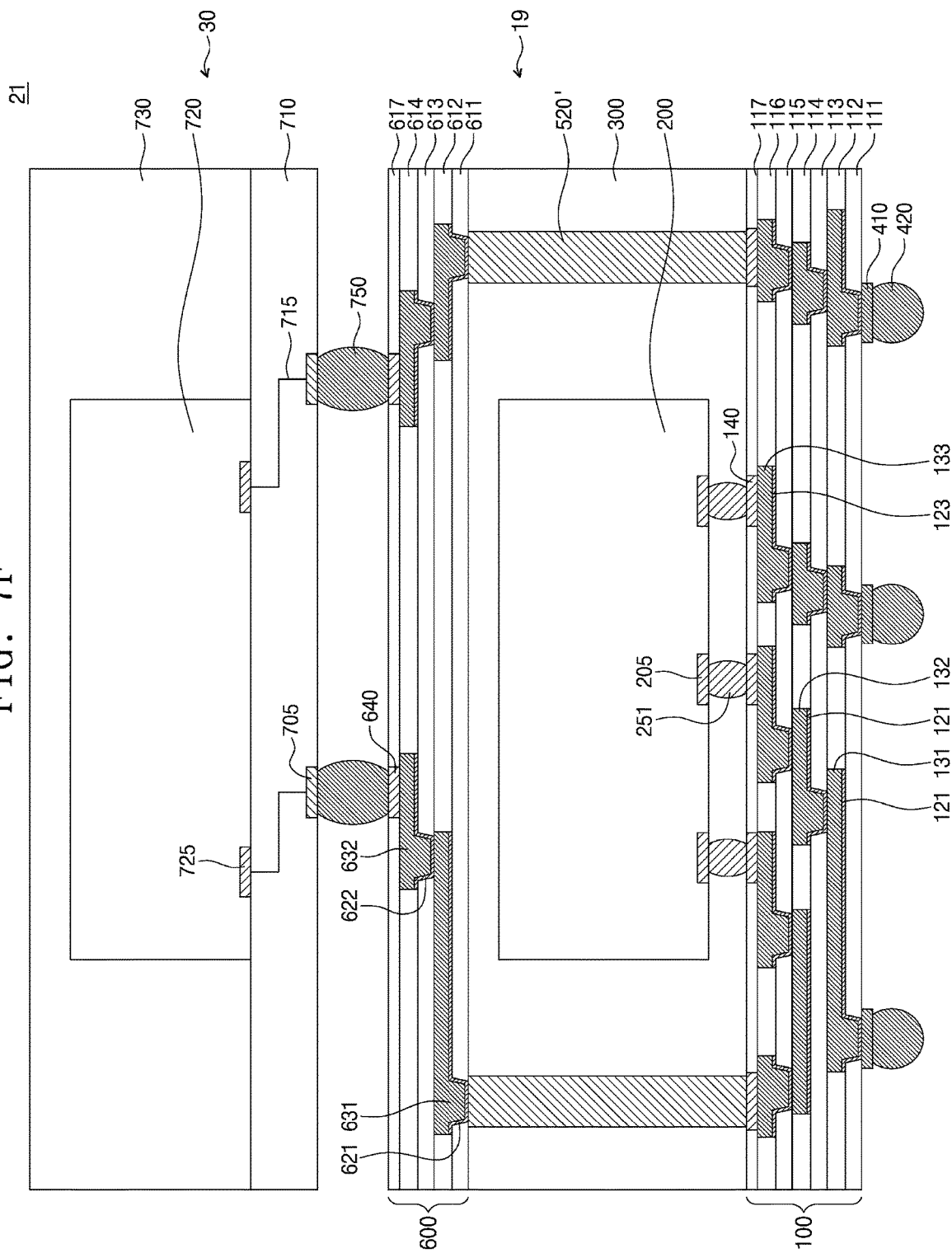

SEMICONDUCTOR PACKAGE AND METHOD OF FABRICATING THE SAME

CROSS-REFERENCE TO RELATED APPLICATION

This U.S. non-provisional patent application claims priority under 35 U.S.C. § 119 to Korean Patent Application No. 10-2018-0107124, filed on Sep. 7, 2018, in the Korean Intellectual Property Office, the disclosure of which is hereby incorporated by reference in its entirety.

BACKGROUND

Embodiments of the inventive concepts relate to a semiconductor package and, more particularly, to a semiconductor package including a redistribution substrate and a method of fabricating the same.

An integrated circuit chip may be realized in the form of a semiconductor package so as to be suitably applied to electronic products. In a typical semiconductor package, one or more semiconductor chips may be mounted on a printed circuit board (PCB) that serves as a package substrate, and may be electrically connected to the PCB through bonding wires or bumps. The PCB and one or more semiconductor chips may be covered by an encapsulant or molding layer. In other types of semiconductor packages, a package substrate may be formed without the use of a PCB, and may be formed as a redistribution substrate. Various techniques for improving reliability of semiconductor packages and reducing sizes of semiconductor packages have been studied with the development of the electronic industry.

SUMMARY

Embodiments of the inventive concepts may provide a semiconductor package with a reduced size and a method of fabricating the same.

In some aspects, a method of fabricating a semiconductor package includes providing a semiconductor chip, forming a redistribution substrate, and fabricating a package including the semiconductor chip disposed on the redistribution substrate. The forming of the redistribution substrate may include forming a first insulating layer on a substrate, the first insulating layer having a first opening formed therein, forming an integrally formed first redistribution pattern in the first opening and on the first insulating layer so that a first portion of the first redistribution pattern is in the first opening, and a second portion of the first redistribution pattern is on the first insulating layer such that part of the first insulating layer is between the second portion of the first redistribution pattern and the substrate, forming a second insulating layer on the first insulating layer to cover the first redistribution pattern, and performing a planarization process on the second insulating layer to expose the first redistribution pattern.

In some aspects, which may include the above aspects, a method of fabricating a semiconductor package includes forming a redistribution substrate configured to be electrically connected to a chip pad of a semiconductor chip. The forming of the redistribution substrate may include forming a first insulating layer on a substrate, the first insulating layer having an opening formed therein, forming a resist pattern on the first insulating layer, the resist pattern having a guide opening formed therein, forming a redistribution pattern in the opening and the guide opening, and planarizing a surface of the redistribution pattern.

In some aspects, which may include the above aspects a semiconductor package may include a redistribution substrate, and a semiconductor chip provided on the redistribution substrate and having a chip pad facing the redistribution substrate. The redistribution substrate may include a first insulating layer having an opening, a redistribution pattern provided in the opening and on the first insulating layer, a seed layer disposed between the first insulating layer and the redistribution pattern, and a second insulating layer provided on the first insulating layer and contacting a sidewall of the redistribution pattern, wherein the seed layer does not extend between the sidewall of the redistribution pattern and the second insulating layer.

BRIEF DESCRIPTION OF THE DRAWINGS

The inventive concepts will become more apparent in view of the attached drawings and accompanying detailed description.

FIGS. 1A to 1F, 1H to 1K, 1M to 1O and 1Q to 1S are cross-sectional views illustrating a method of fabricating a semiconductor package, according to some embodiments of the inventive concepts.

FIGS. 4A to 4F are cross-sectional views illustrating a method of fabricating a semiconductor package, according to some embodiments of the inventive concepts.

FIGS. 6F and 6G are cross-sectional views illustrating a method of fabricating a semiconductor package, according to some embodiments of the inventive concepts.

FIGS. 7A and 7B are cross-sectional views illustrating a method of fabricating a semiconductor package, according to some embodiments of the inventive concepts.

FIG. 7F is a cross-sectional view illustrating a semiconductor package according to some embodiments of the inventive concepts.

DETAILED DESCRIPTION

Figure 1A:
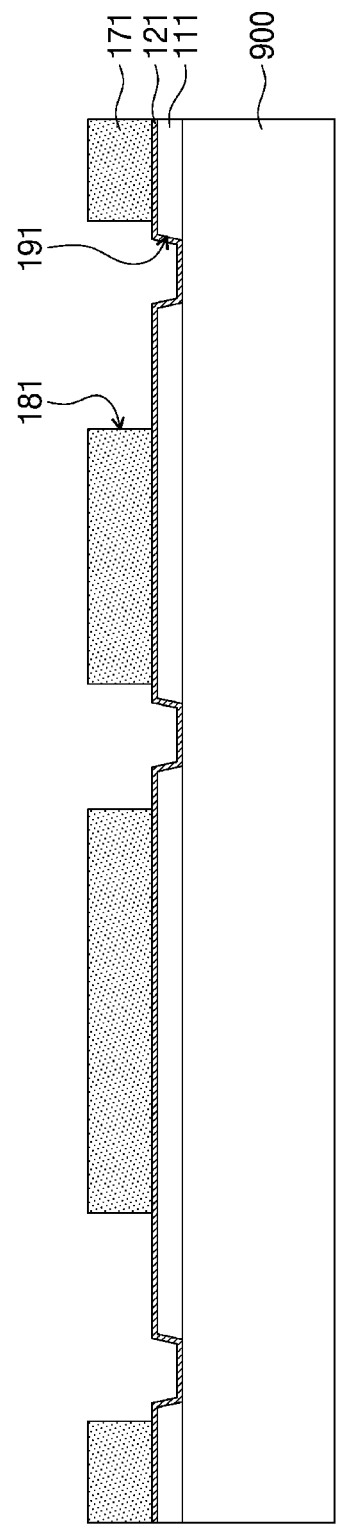

The same reference numerals or the same reference designators may denote the same elements or components throughout the specification. Semiconductor packages and methods of fabricating the same according to embodiments of the inventive concepts will be described hereinafter.

FIGS. 1A to 1F, 1H to 1K, 1M to 1O and 1Q to 1S are cross-sectional views illustrating a method of fabricating a semiconductor package, according to some embodiments of the inventive concepts. FIG. 1G is an enlarged view of a region 'A' of FIG. 1F. FIG. 1L is an enlarged view of a region 'A' of FIG. 1K. FIG. 1P is an enlarged view of a region 'A' of FIG. 1O.

As described herein, a semiconductor package includes a package substrate, which in some embodiments disclosed herein is a redistribution substrate, one or more semiconductor chips mounted on the package substrate, and an encapsulant or molding layer covering the package substrate and the one or more semiconductor chips. A "redistribution substrate," or "redistribution package substrate" as discussed herein, is different from a PCB package substrate in both its structure and its formation. For example, it may be formed of redistribution layers, which may be formed initially as one or more layers on a dummy substrate or carrier substrate. The dummy substrate or carrier substrate, also described as a temporary or sacrificial substrate or carrier substrate, is removed from the redistribution substrate prior to the semiconductor package being completed.

Referring to FIG. 1A, a first insulating layer 111, a first seed layer 121, and a first resist pattern 171 may be formed on a carrier substrate 900. In some embodiments, a carrier adhesive layer (not shown) may be disposed between the carrier substrate 900 and the first insulating layer 111. The carrier adhesive layer may adhere the first insulating layer 111 to the carrier substrate 900. Hereinafter, it may be understood that when a component or element is formed/provided on the carrier substrate 900, it may be formed/provided directly on the carrier substrate 900 or may be formed/provided on the carrier substrate 900 with the carrier adhesive layer interposed therebetween. In addition, it may be understood that when the carrier substrate 900 is exposed, the carrier substrate 900 or the carrier adhesive layer may be exposed. For example, the first insulating layer 111 may be formed by a coating process such as a spin coating process or a slit coating process. For example, the first insulating layer 111 may include a photosensitive polymer. For example, the photosensitive polymer may include at least one of photosensitive polyimide, polybenzoxazole, a phenol-based polymer, or a benzocyclobutene-based polymer.

The first insulating layer 111 may be patterned to form a first opening 191 in the first insulating layer 111. The first opening 191 may expose the carrier substrate 900 or the carrier adhesive layer. A bottom surface of the first opening 191 may correspond to a top surface of the carrier substrate 900 or a top surface of the carrier adhesive layer. The process of patterning the first insulating layer 111 may be performed by exposure and development processes. The development process may be a positive tone development process or a negative tone development process. Thereafter, a process of hardening the first insulating layer 111 may be performed.

The first seed layer 121 may be formed in the first opening 191 and on a top surface of the first insulating layer 111. The first seed layer 121 may conformally cover the bottom surface and a sidewall of the first opening 191 and the top surface of the first insulating layer 111. The first seed layer 121 may cover the carrier substrate 900 or the carrier adhesive layer exposed through the first opening 191. The first seed layer 121 may include a conductive material. For example, the first seed layer 121 may include at least one of copper (Cu) or titanium (Ti).

The first resist pattern 171 may be formed on the first seed layer 121. The first resist pattern 171, which may be a photoresist pattern formed by performing photolithography on a photoresist material, may have a first guide opening 181 penetrating the first resist pattern 171. The first guide opening 181 may expose a top surface of the first seed layer 121. At least a portion of the first guide opening 181 may overlap with the first opening 191 when viewed in a plan view. Thus, these openings may together form a single opening having two portions: a bottom portion having a first area and volume, and a top portion, which may have a second area and volume greater than the first area and volume. A sidewall of the first guide opening 181 may be substantially perpendicular.

Figure 1B:
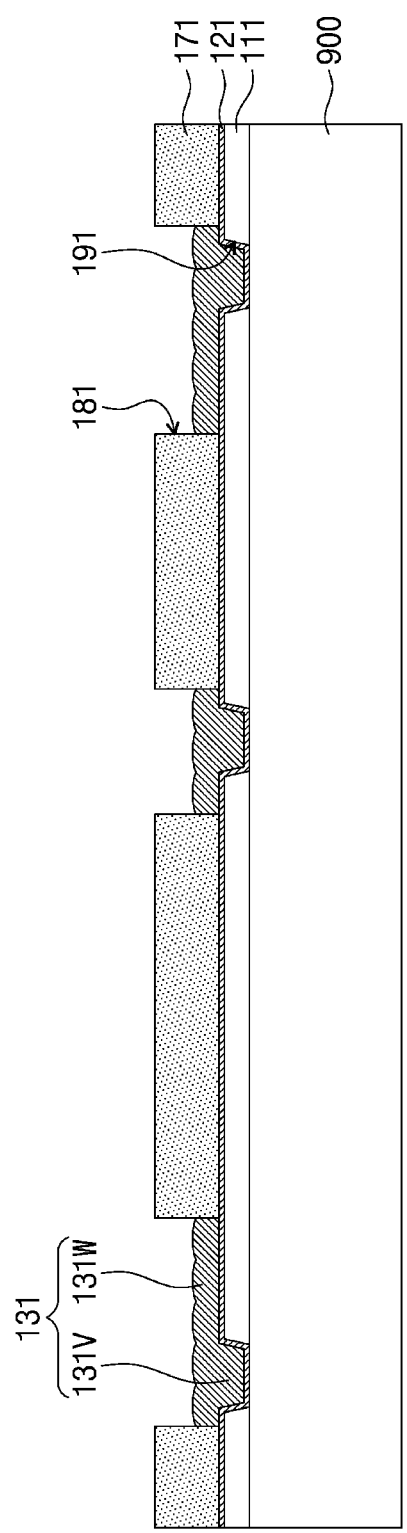

Referring to FIG. 1B, a first redistribution pattern 131 is formed in the first opening 191 and the first guide opening 181. The first redistribution pattern 131 may be formed by performing an electroplating process using the first seed layer 121 as an electrode. The first redistribution pattern 131 may include a metal such as copper. The first redistribution pattern 131 may include a first via portion 131V and a first interconnection portion 131W. The first via portion 131V may be provided in the first opening 191. The first interconnection portion 131W may be provided in the first guide opening 181. The first interconnection portion 131W may be electrically connected to the first via portion 131V, with the first via portion 131V extending vertically between the carrier substrate 900 and the first interconnection portion 131W, and the first interconnection portion 131W extending more in a horizontal direction than the first via portion 131V. The first interconnection portion 131W and the first via portion 131V may be formed by a single process.

Figure 1C:
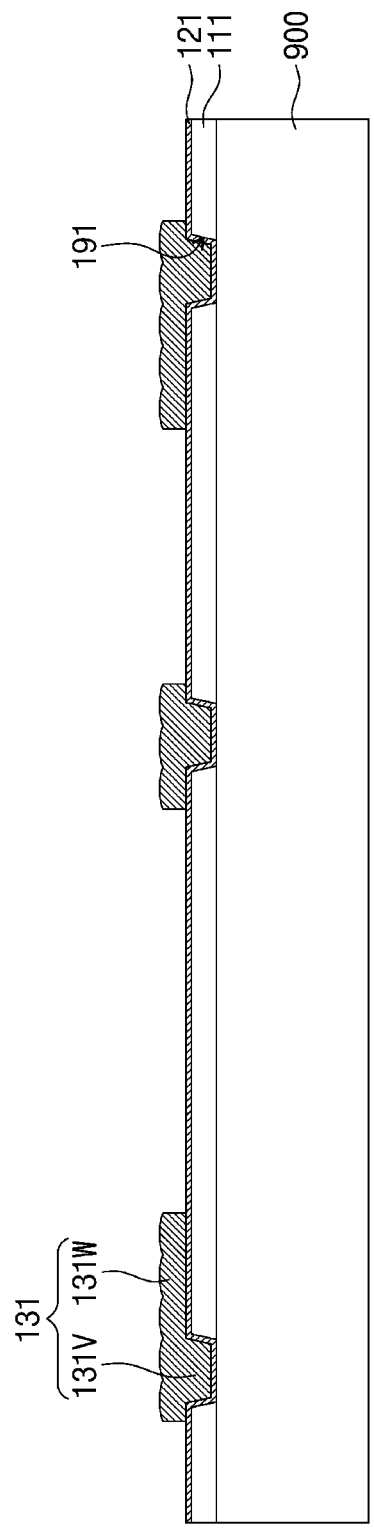

Referring to FIG. 1C, the first resist pattern 171 is removed to expose the top surface of the first seed layer 121. The first resist pattern 171 may be removed, for example, by a strip process. Sidewalls of the first interconnection portion 131W of the first redistribution pattern 131 may be exposed by the removal of the first resist pattern 171.

Figure 1D:
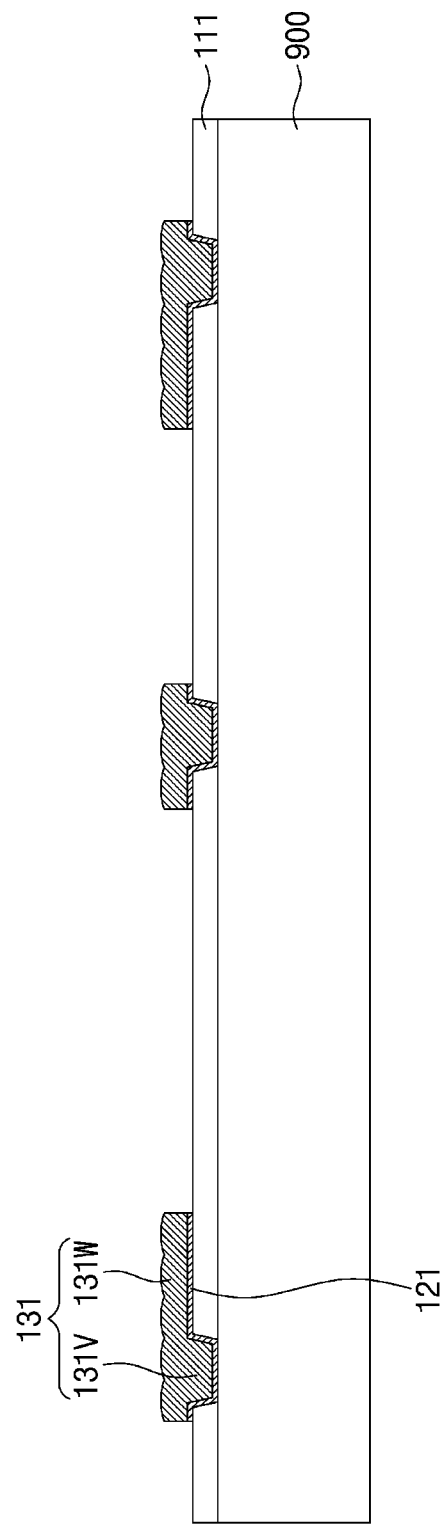

Referring to FIG. 1D, the exposed portion of the first seed layer 121 is removed to expose the top surface of the first insulating layer 111. The removal of the first seed layer 121 may be performed by an etching process, for example, a wet etching process. In the etching process, the first redistribution pattern 131 may have an etch selectivity with respect to the first seed layer 121. After the etching process, the first redistribution pattern 131 and another portion of the first seed layer 121 may not be removed but may remain. The other, remaining portion of the first seed layer 121 may be a portion disposed between the first redistribution pattern 131 and the first insulating layer 111.

Figure 1E:
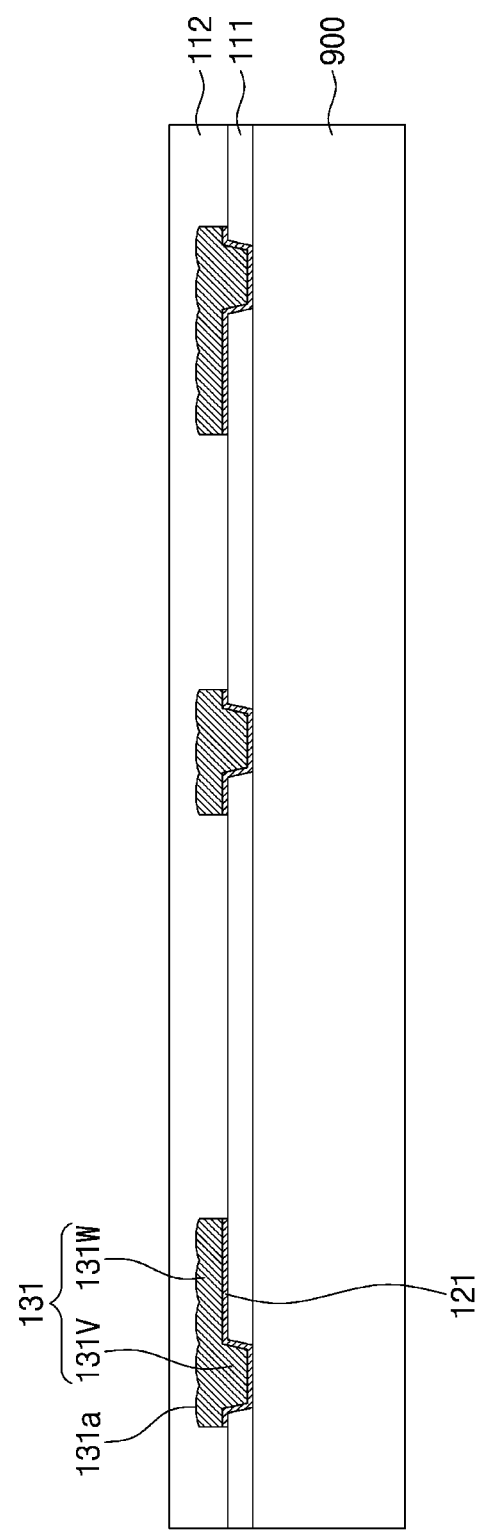
Figure 1G:
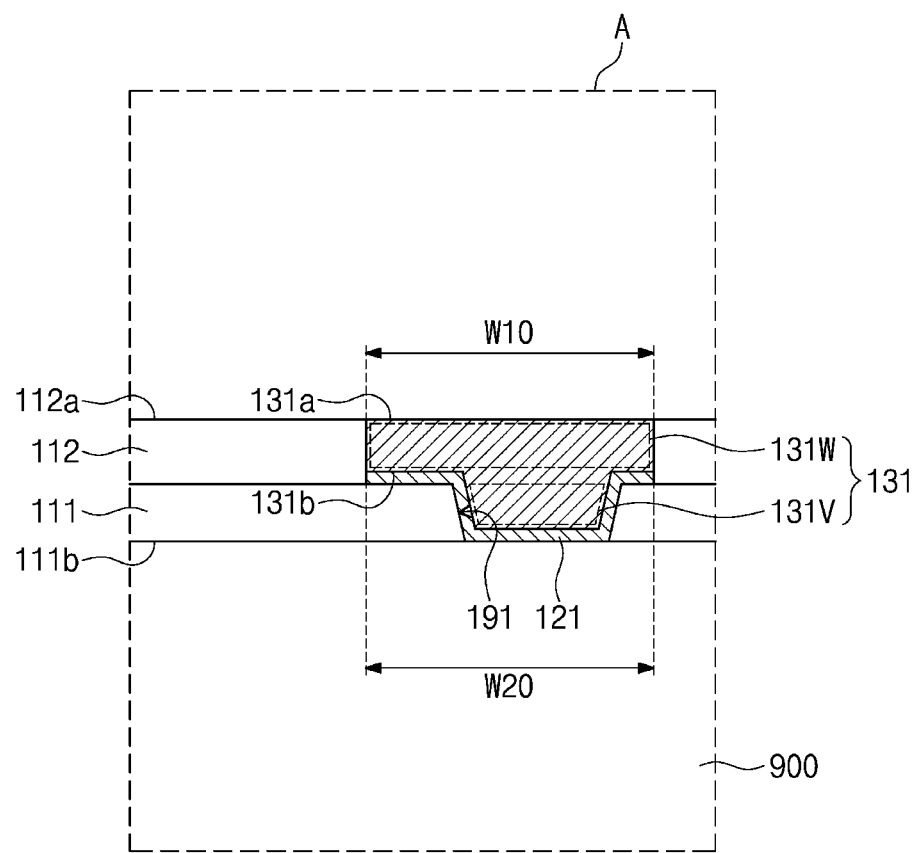
FIG. 1G is an enlarged view of a region 'A' of FIG. 1F.

Referring to FIG. 1E, a second insulating layer 112 may be formed on the first insulating layer 111 to cover the first redistribution pattern 131. The second insulating layer 112 may cover the exposed top surface of the first insulating layer 111 and a surface 131a and a sidewall of the first redistribution pattern 131. The surface 131a of the first redistribution pattern 131 may correspond to a top surface of the first redistribution pattern 131. The second insulating layer 112 may be in physical contact with at least a portion of the sidewall of the first redistribution pattern 131 (e.g., the sidewall of the first interconnection portion 131W). As discussed herein, the term "contact" refers to a direct connection, e.g., touching. Since the first seed layer 121 is formed before the formation of the first resist pattern 171 as described with reference to FIG. 1A, the first seed layer 121 may not extend between the second insulating layer 112 and the first redistribution pattern 131. The second insulating layer 112 may include a photosensitive polymer. In one embodiment, the second insulating layer 112 may include the same material as the first insulating layer 111. An interface between the first and second insulating layers 111 and 112 may not be observed, even if the layers are formed separately. However, embodiments of the inventive concepts are not limited thereto.

Referring to FIGS. 1F and 1G, the second insulating layer 112 and the first redistribution pattern 131 are planarized. In some embodiments, a planarization process may be performed on the second insulating layer 112. The planarization process may be performed by a chemical mechanical polishing (CMP) method or a mechanical method. The mechanical method may be a surface cutting method.

The planarization process may include removing the second insulating layer 112 disposed on the surface 131a of the first redistribution pattern 131 to expose the surface 131a of the first redistribution pattern 131, and planarizing the exposed surface 131a of the first redistribution pattern 131. The second insulating layer 112 may be disposed locally between the first redistribution patterns 131 by the removal of the second insulating layer 112 disposed on the surface 131a of the first redistribution pattern 131. Thereafter, the second insulating layer 112 may also be planarized during the planarization of the exposed surface 131a of the first redistribution pattern 131. After the planarization process, the planarized surface 131a of the first redistribution pattern 131 may be substantially coplanar with a surface 112a of the second insulating layer 112. The surface 112a of the second insulating layer 112 may correspond to a top surface of the second insulating layer 112. The planarized surface 131a of the first redistribution pattern 131 may be substantially flat. The planarized surface 131a of the first redistribution pattern 131 may have a surface roughness, for example, of 0.01 μm to 0.4 μm. Terms such as "same," "equal," "planar," "coplanar," "parallel," or "perpendicular," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially flat," may be exactly the same, equal, or flat, or may be the same, equal, or planar within acceptable variations that may occur, for example, due to manufacturing processes.

The first redistribution pattern 131 may be provided in plurality. By the planarization process, the planarized surfaces 131a of the first redistribution patterns 131 may be disposed at substantially the same level. A difference between a maximum distance between a bottom surface 111b of the first insulating layer 111 and the surfaces 131a of the first redistribution patterns 131 and a minimum distance between a bottom surface 111b of the first insulating layer 111 and the surfaces 131a of the first redistribution patterns 131 may be reduced. For example, the maximum distance between the bottom surface 111b of the first insulating layer 111 and the surfaces 131a of the first redistribution patterns 131 may range from 100% to 120% of the minimum distance between the bottom surface 111b of the first insulating layer 111 and the surfaces 131a of the first redistribution patterns 131. Here, the maximum distance may be a distance between the bottom surface 111b of the first insulating layer 111 and an uppermost one of the surfaces 131a of the first redistribution patterns 131. The minimum distance may be a distance between the bottom surface 111b of the first insulating layer 111 and a lowermost one of the surfaces 131a of the first redistribution patterns 131.

The first seed layer 121 may not be exposed by the planarization process.

If a guide opening is formed in the second insulating layer 112 in place of the first resist pattern 171 unlike the descriptions of FIG. 1A, a process of hardening the second insulating layer 112 may be performed after the formation of the guide opening. At this time, the guide opening may be deformed in the process of hardening the second insulating layer 112. For example, a width of the guide opening at a top surface of the second insulating layer 112 may be greater than 120% of a width of the guide opening at a bottom surface of the second insulating layer 112, to have an overall tapered shape with slanted sidewalls. In this case, the first interconnection portion 131W may have a shape corresponding to that of the guide opening (e.g., with tapered sidewalls).

However, according to embodiments described herein, the first redistribution pattern 131 may be formed in the first guide opening 181 defined in the first resist pattern 171 before the formation of the second insulating layer 112, as described with reference to FIG. 1A. A separate hardening process may not be required in a process of forming the first resist pattern 171. Thereafter, the second insulating layer 112 may be formed. Thus, the first interconnection portion 131W may have a relatively uniform width, and may have substantially vertical sidewalls. For example, like FIG. 1G, a width W10 of the first interconnection portion 131W at the surface 131a of the first redistribution pattern 131 (i.e., at one surface of the first interconnection portion 131W) may range from 100% to 120% of a width W20 of the first interconnection portion 131W at another surface 131b of the first interconnection portion 131W. The other surface 131b of the first interconnection portion 131W may be opposite to the surface 131a of the first redistribution pattern 131 and may face the first insulating layer 111. The other surface 131b of the first interconnection portion 131W may contact the first seed layer 121. The first redistribution pattern 131 may be provided in plurality like FIG. 1F. Since the first interconnection portions 131W of the first redistribution patterns 131 have substantially uniform widths, the first interconnection portions 131W may have a fine pitch. For example, a horizontal distance between the first interconnection portions 131W may range from 0.1 μm to 10 μm, in particular, from 0.1 μm to 5 μm. A minimum width of the first interconnection portions 131W may be relatively narrow. For example, the minimum width of the first redistribution patterns 131 may range from 0.1 μm to 10 μm, and in particular, from 0.1 μm to 5 μm.

Figure 1H:
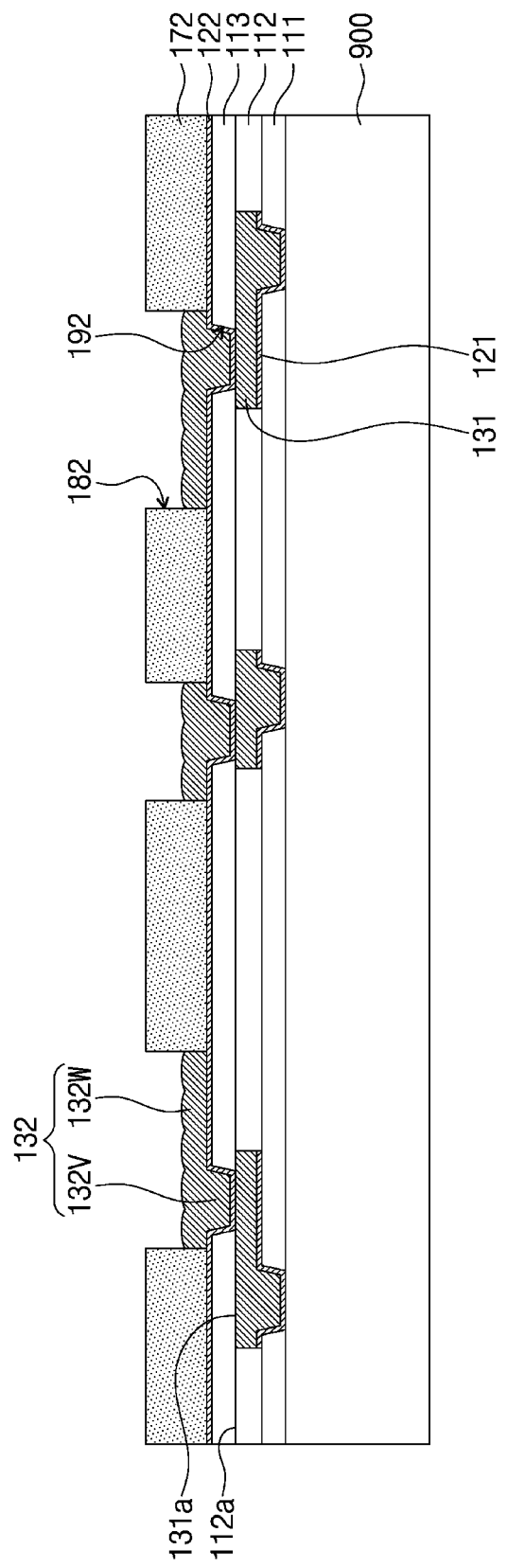

Referring to FIG. 1H, a third insulating layer 113, a second seed layer 122, a second resist pattern 172, and a second redistribution pattern 132 may be formed on the second insulating layer 112. The third insulating layer 113 may be formed on the surface 131a of the first redistribution pattern 131 and the surface 112a of the second insulating layer 112. The third insulating layer 113 may include a photosensitive polymer. The third insulating layer 113 may be formed by a spin coating process or a slit coating process. Since the surface 131a of the first redistribution pattern 131 and the surface 112a of the second insulating layer 112 are planarized, a top surface of the third insulating layer 113 may be substantially flat.

The third insulating layer 113 may be patterned to form a second opening 192 in the third insulating layer 113. The second opening 192 may expose the surface 131a of the first redistribution pattern 131. The surface 131a of the first redistribution pattern 131 may be the planarized top surface of the first redistribution pattern 131. The process of patterning the third insulating layer 113 may be performed by exposure and development processes. Thereafter, a process of hardening the third insulating layer 113 may be performed.

The second seed layer 122 may be formed in the second opening 192 and on a top surface of the third insulating layer 113. The second seed layer 122 may conformally cover a bottom surface and a sidewall of the second opening 192 and the top surface of the third insulating layer 113. The second seed layer 122 may contact the surface 131a of the first redistribution pattern 131 exposed by the second opening 192. The surface 131a of the first redistribution pattern 131 may have a relatively small surface roughness. Thus, a contact resistance between the first redistribution pattern 131 and the second seed layer 122 may be reduced. The second seed layer 122 may include a conductive material. For example, the second seed layer 122 may include at least one of copper (Cu) or titanium (Ti).

The second resist pattern 172 may be formed on the second seed layer 122. The second resist pattern 172 may have a second guide opening 182 formed therein by a patterning process (e.g., where a second resist layer such as a photoresist material is patterned using photolithography). The second guide opening 182 may expose at least a portion of a top surface of the second seed layer 122. The second guide opening 182 may have a substantially perpendicular sidewall. A separate hardening process may not be performed in the process of forming the second resist pattern 172.

A second redistribution pattern 132 may be formed in the second opening 192 and the second guide opening 182. The second redistribution pattern 132 may be formed by performing an electroplating process using the second seed layer 122 as an electrode. The second redistribution pattern 132 may include a metal such as copper.

According to the embodiments described herein, since the surface 131a of the first redistribution pattern 131 and the surface 112a of the second insulating layer 112 are planarized as described with reference to FIG. 1F, the top surface of the third insulating layer 113 may be substantially flat. The second resist pattern 172 and the second redistribution pattern 132 may be formed on the top surface of the third insulating layer 113. Thus, patterning accuracy may be improved in the processes of forming the second resist pattern 172 and the second redistribution pattern 132. As a result, the second redistribution pattern 132 may be formed in a desired shape at a desired position.

Each of the second opening 192, the second guide opening 182 and the second redistribution pattern 132 may be formed in plurality. If the surfaces 131a of the first redistribution patterns 131 are provided at greatly different levels, it may be difficult for at least one of the second openings 192 to expose a corresponding one of the first redistribution patterns 131. However, according to the embodiments described herein, the surfaces 131a of the first redistribution patterns 131 may be provided at substantially the same or similar levels, and thus the second openings 192 may be formed well. For example, the second openings 192 may expose the first redistribution patterns 131, respectively. Thus, the second redistribution patterns 132 may be electrically connected to the first redistribution patterns 131 through the second seed layer 122, respectively. The second redistribution patterns 132 may have substantially uniform resistances, and thus electrical characteristics of the second redistribution patterns 132 may be improved.

The second redistribution pattern 132 may include a second via portion 132V and a second interconnection portion 132W. The second via portion 132V may be provided in the second opening 192. The second interconnection portion 132W may be provided in the second guide opening 182. The second interconnection portion 132W may be connected to the second via portion 132V. A width and a pitch of the second interconnection portion 132W will be described later in detail with reference to FIG. 1L.

Thereafter, the second resist pattern 172 may be removed to expose a portion of the second seed layer 122 and a sidewall of the second interconnection portion 132W of the second redistribution pattern 132.

Figure 1I:
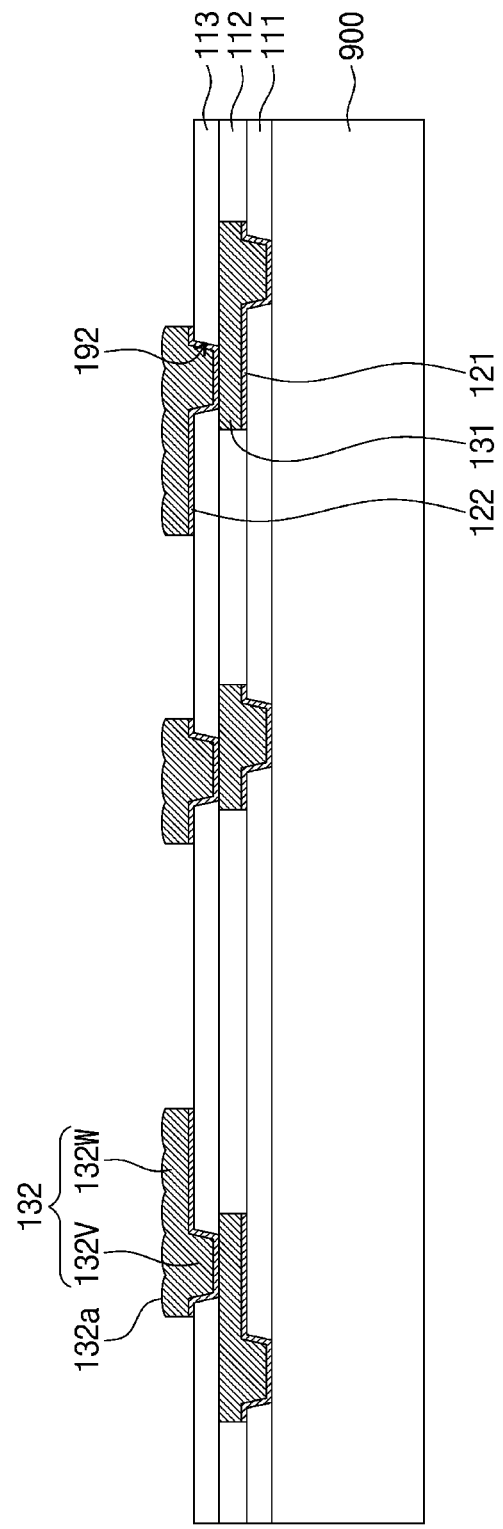

Referring to FIG. 1I, the exposed portion of the second seed layer 122 may be removed to expose the third insulating layer 113. The removal of the second seed layer 122 may be performed, for example, by an etching process. In the etching process, the second redistribution pattern 132 may have an etch selectivity with respect to the second seed layer 122. After the etching process, the second redistribution pattern 132 and another portion of the second seed layer 122 may remain. The other portion of the second seed layer 122 may be a portion provided between the second redistribution pattern 132 and the third insulating layer 113.

Figure 1J:
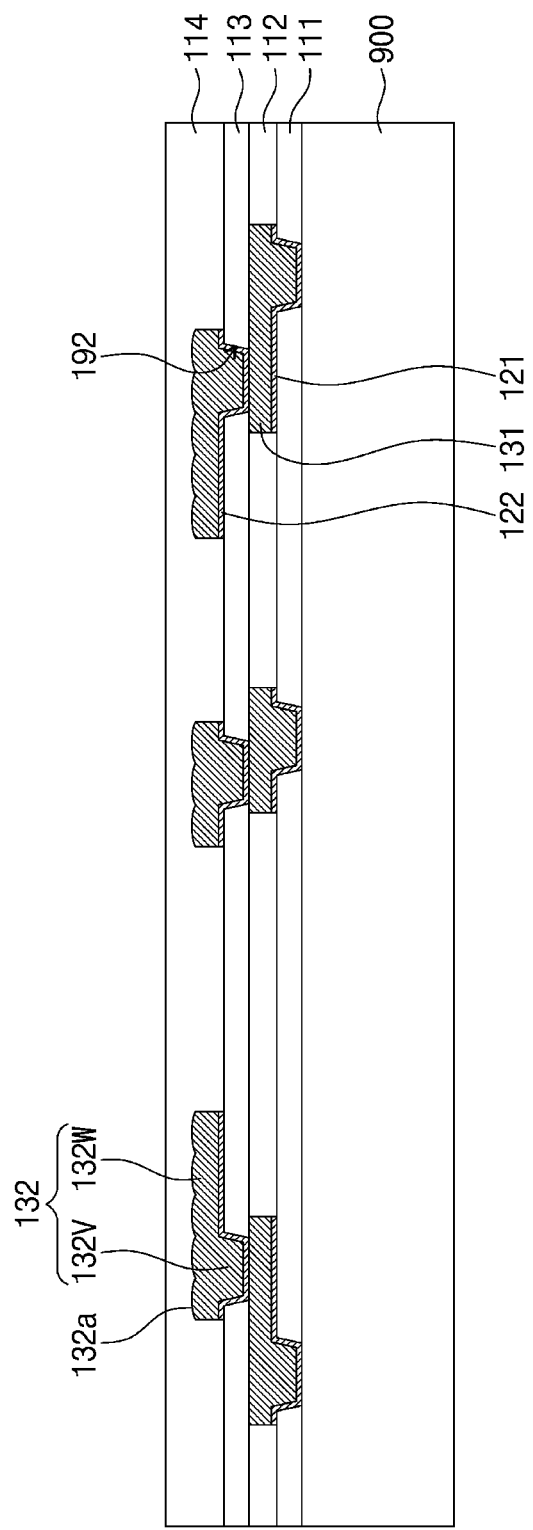

Referring to FIG. 1J, a fourth insulating layer 114 may be formed on the third insulating layer 113 to cover the second redistribution pattern 132. For example, the fourth insulating layer 114 may cover a surface 132a of the second redistribution pattern 132 and an exposed top surface of the third insulating layer 113. The fourth insulating layer 114 may contact at least a portion of a sidewall of the second redistribution pattern 132. For example, the fourth insulating layer 114 may contact the sidewall of the second interconnection portion 132W. The second seed layer 122 may not extend between the fourth insulating layer 114 and the second redistribution pattern 132. The fourth insulating layer 114 may include a photosensitive polymer.

Figure 1K:
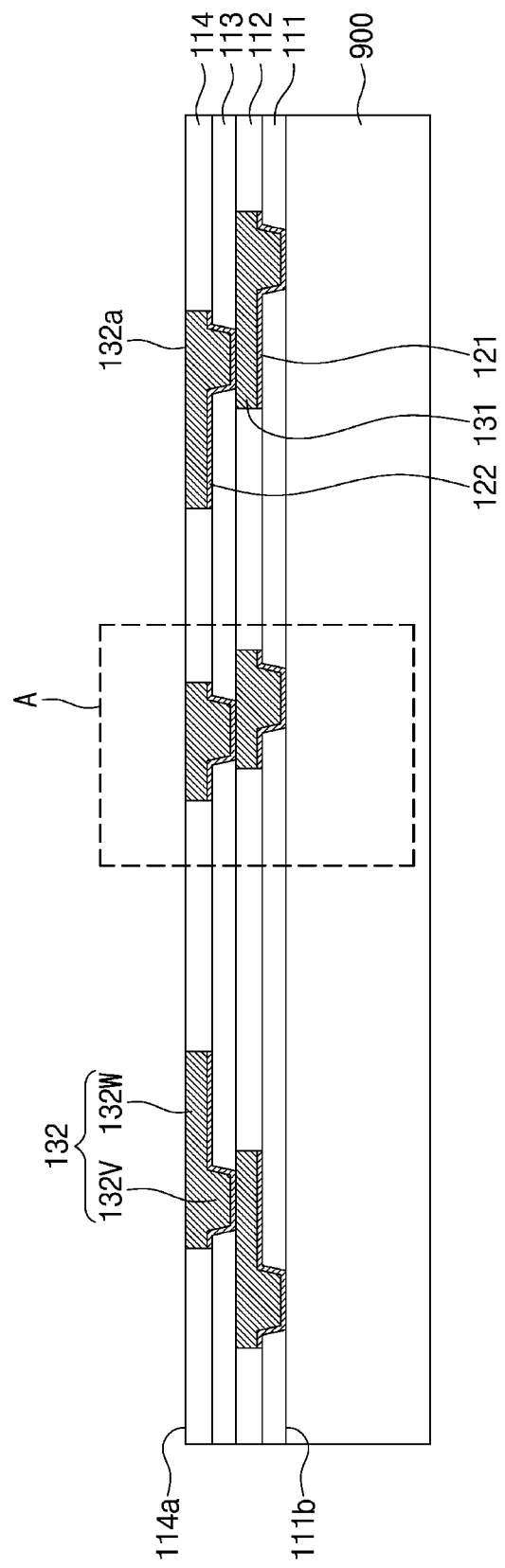
Figure 1L:
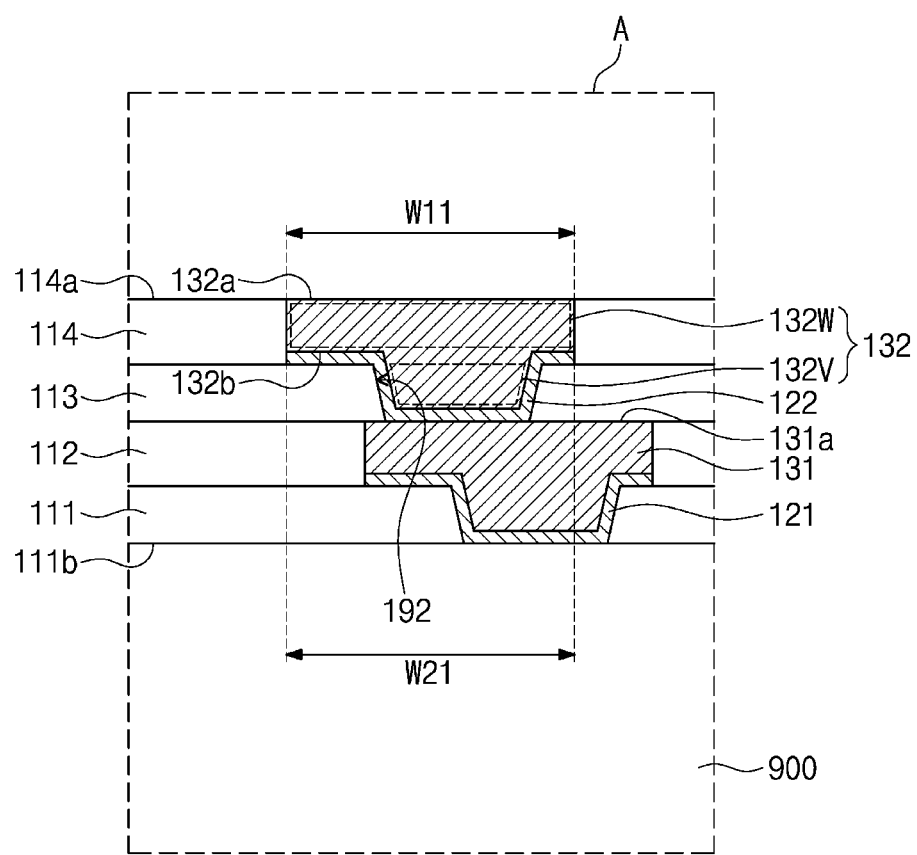
FIG. 1L is an enlarged view of a region 'A' of FIG. 1K.

Referring to FIGS. 1K and 1L, the fourth insulating layer 114 and the second redistribution pattern 132 are planarized. The planarization process may be performed by a chemical mechanical polishing (CMP) method or a mechanical method. The planarization process may include removing the fourth insulating layer 114 disposed on the second redistribution pattern 132 to expose the surface 132a of the second redistribution pattern 132, and planarizing the exposed surface 132a of the second redistribution pattern 132. The fourth insulating layer 114 may be disposed locally between the second redistribution patterns 132 by the removal of the fourth insulating layer 114 disposed on the surface 132a of the second redistribution pattern 132. The surface 132a of the second redistribution pattern 132 may correspond to a top surface of the second redistribution pattern 132. A surface 114a of the fourth insulating layer 114 may also be planarized during the planarization of the exposed surface 132a of the second redistribution pattern 132. The surface 114a of the fourth insulating layer 114 may correspond to a top surface of the fourth insulating layer 114. After the planarization process, the surface 132a of the second redistribution pattern 132 may be substantially coplanar with the surface 114a of the fourth insulating layer 114. The planarized surface 132a of the second redistribution pattern 132 may be substantially flat. For example, the planarized surface 132a of the second redistribution pattern 132 may have a surface roughness of 0.01 μm to 0.4 μm.

The second redistribution pattern 132 may be provided in plurality as described above. By the planarization process, the planarized surfaces 132a of the second redistribution patterns 132 may be disposed at substantially the same level. A difference between a maximum distance and a minimum distance between the bottom surface 111b of the first insulating layer 111 and the surfaces 132a of the second redistribution patterns 132 may be reduced. For example, the maximum distance between the bottom surface 111b of the first insulating layer 111 and the surfaces 132a of the second redistribution patterns 132 may range from 100% to 120% of the minimum distance between the bottom surface 111b of the first insulating layer 111 and the surfaces 132a of the second redistribution patterns 132. Here, the maximum distance may be a distance between the bottom surface 111b of the first insulating layer 111 and an uppermost one of the surfaces 132a of the second redistribution patterns 132. The minimum distance may be a distance between the bottom surface 111b of the first insulating layer 111 and a lowermost one of the surfaces 132a of the second redistribution patterns 132.

The second interconnection portions 132W may have a fine pitch. For example, a horizontal distance between the second interconnection portions 132W may range from 0.1 μm to 10 μm, in particular, from 0.1 μm to 5 μm. A minimum width of the second interconnection portions 132W may be relatively narrow. For example, the minimum width of the second interconnection portions 132W may range from 0.1 μm to 10 μm, in particular, from 0.1 μm to 5 μm.

Since each of the second interconnection portions 132W is formed in the second guide opening 182 defined by the second resist pattern 172, each of the second interconnection portions 132W may have a relatively uniform width. For example, a width W11 of the second interconnection portion 132W at the surface 132a of the second redistribution pattern 132 (i.e., at one surface of the second interconnection portion 132W) may range from 100% to 120% of a width W21 of the second interconnection portion 132W at another surface 132b of the second interconnection portion 132W. The other surface 132b of the second interconnection portion 132W may face the first insulating layer 111 and may be opposite to the surface 132a of the second redistribution pattern 132. The other surface 132b of the second interconnection portion 132W may be in contact with the second seed layer 122. Different surfaces described herein may be described using the naming convention of "first," "second," etc. Furthermore, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. The second seed layer 122 may not be exposed by the planarization process.

Figure 1M:
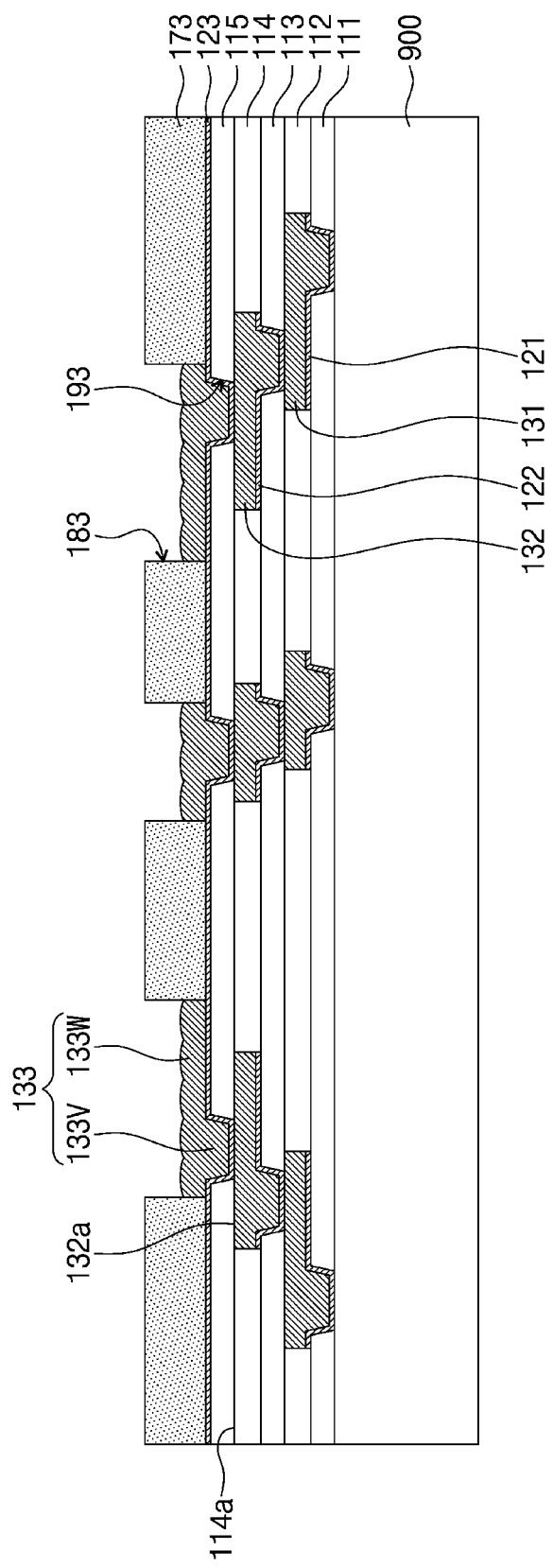

Referring to FIG. 1M, a fifth insulating layer 115, a third seed layer 123, a third resist pattern 173, and third redistribution patterns 133 may be formed on the fourth insulating layer 114. The fifth insulating layer 115 may cover the surfaces 132a of the second redistribution patterns 132 and the surface 114a of the fourth insulating layer 114. The fifth insulating layer 115 may include a photosensitive polymer.

The fifth insulating layer 115 may be patterned to form third openings 193 in the fifth insulating layer 115. The third openings 193 may expose the surfaces 132a of the second redistribution patterns 132, respectively. The process of patterning the fifth insulating layer 115 may be performed by exposure and development processes. Thereafter, a process of hardening the fifth insulating layer 115 may be performed.

The third seed layer 123 may be formed in the third openings 193 and on a top surface of the fifth insulating layer 115. The third seed layer 123 may conformally cover bottom surfaces and sidewalls of the third openings 193 and the top surface of the fifth insulating layer 115. The third seed layer 123 may contact the surfaces 132a of the second redistribution patterns 132 exposed by the third openings 193. The surfaces 132a of the second redistribution patterns 132 may have relatively small surface roughnesses, and thus a contact resistance between the third seed layer 123 and the second redistribution patterns 132 may be reduced. The third seed layer 123 may include a conductive material. For example, the third seed layer 123 may include at least one of copper (Cu) or titanium (Ti).

The third resist pattern 173 may be formed on the third seed layer 123. The third resist pattern 173 may have third guide openings 183. Each of the third guide openings 183 may expose a portion of the third seed layer 123. A separate hardening process may not be performed in the process of forming the third resist pattern 173. The third guide openings 183 may have substantially perpendicular sidewalls.

The third redistribution patterns 133 may be formed in the third openings 193 and the third guide openings 183 to cover the third seed layer 123. The third redistribution patterns 133 may be formed by performing an electroplating process using the third seed layer 123 as an electrode. The third redistribution patterns 133 may include a metal such as copper. Each of the third redistribution patterns 133 may include a third via portion 133V and a third interconnection portion 133W. The third via portion 133V may be provided in one of the third openings 193. The third interconnection portion 133W may be provided in one of the third guide openings 183. The third interconnection portion 133W may be connected to the third via portion 133V. A width and a pitch of the third interconnection portion 133W will be described later in detail with reference to FIG. 1P. Each of the third redistribution patterns 133 may be electrically connected to a corresponding one of the second redistribution patterns 132 through the third seed layer 123.

Since the surface 132a of the second redistribution pattern 132 and the surface 114a of the fourth insulating layer 114 are planarized as described with reference to FIGS. 1K and 1L, a top surface of the fifth insulating layer 115 may be substantially flat. The third resist pattern 173 and the third redistribution pattern 133 may be formed on the top surface of the fifth insulating layer 115. Thus, patterning accuracy may be improved in the processes of forming the third resist pattern 173 and the third redistribution patterns 133.

By the planarization process, the surfaces 132a of the second redistribution patterns 132 may be provided at substantially the same or similar levels. Thus, the third openings 193 may be formed well. For example, each of the third openings 193 may expose the second redistribution pattern 132. Thus, the third redistribution patterns 133 may be electrically connected to the second redistribution patterns 132, respectively. The third redistribution patterns 133 may have substantially uniform resistances, and thus electrical characteristics of the third redistribution patterns 133 may be improved. Thereafter, the third resist pattern 173 may be removed to expose a portion of the third seed layer 123 and a sidewall of the third interconnection portion 133W.

Figure 1N:
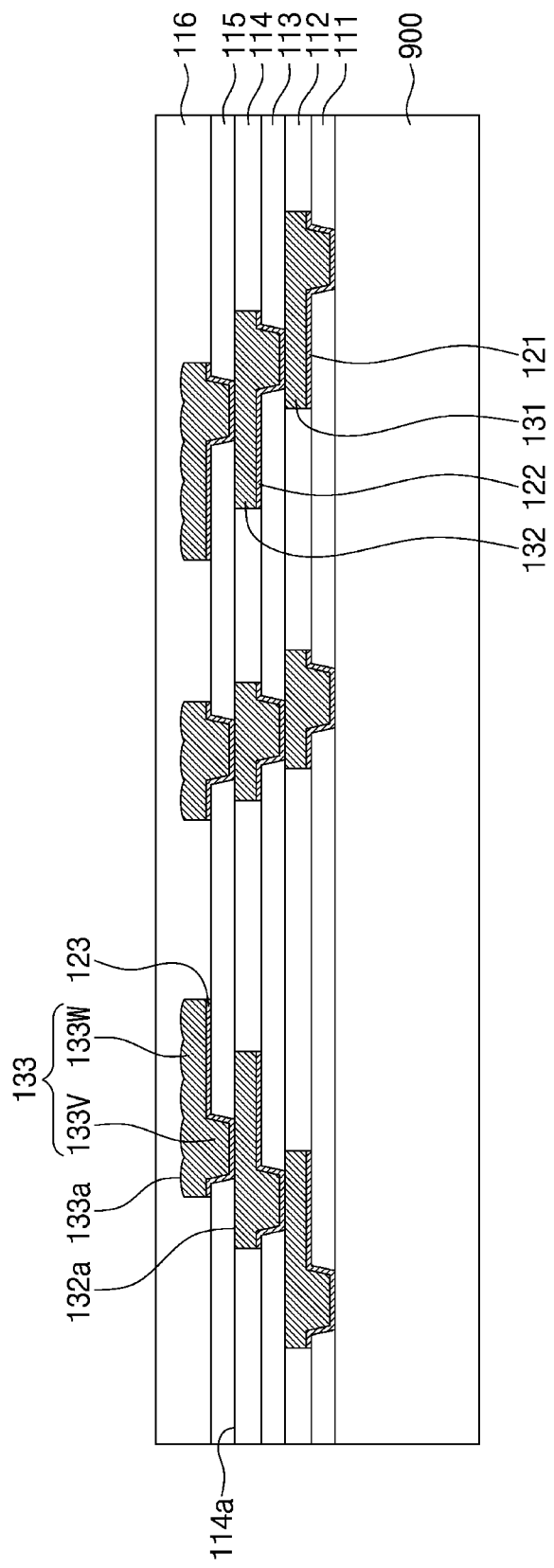
Figure 1P:
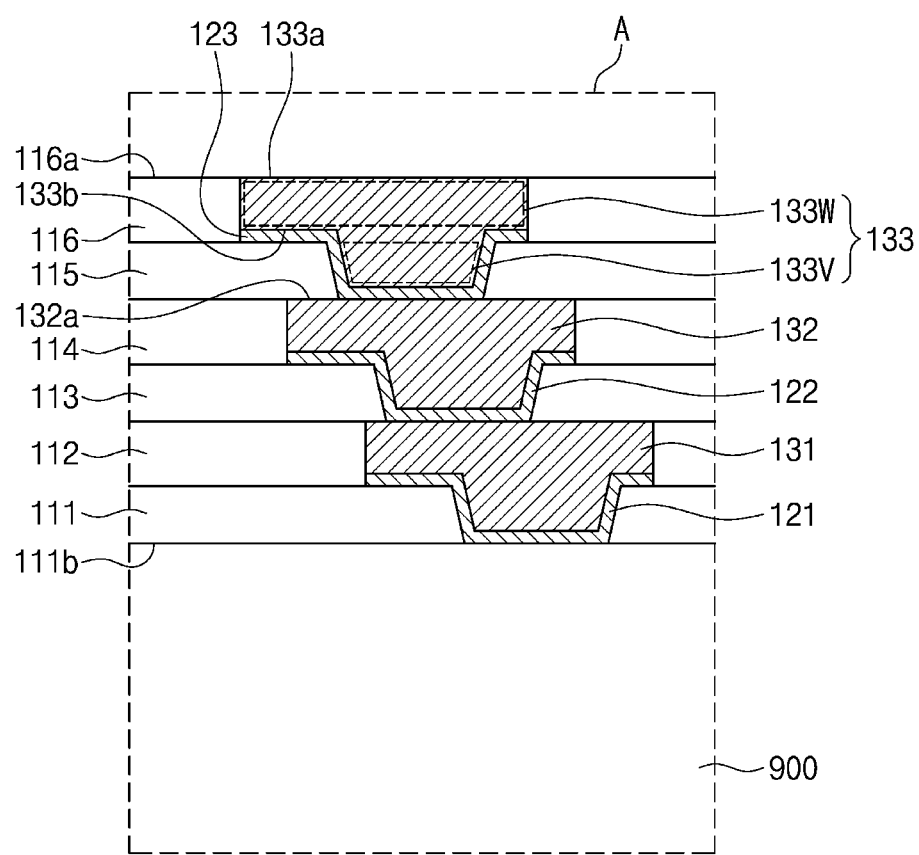
FIG. 1P is an enlarged view of a region 'A' of FIG. 1O.

Referring to FIG. 1N, the exposed portion of the third seed layer 123 may be removed by an etching process to expose the fifth insulating layer 115. In the etching process, the third redistribution patterns 133 may have an etch selectivity with respect to the third seed layer 123. After the etching process, another portion of the third seed layer 123 may remain between the third redistribution pattern 133 and the fifth insulating layer 115.

A sixth insulating layer 116 may be formed on the fifth insulating layer 115. For example, the sixth insulating layer 116 may cover surfaces 133a of the third redistribution patterns 133 and the top surface of the fifth insulating layer 115. The sixth insulating layer 116 may contact sidewalls of the third interconnection portions 133W. The third seed layer 123 may not extend between the sixth insulating layer 116 and the third redistribution patterns 133. The sixth insulating layer 116 may include a photosensitive polymer.

Referring to FIGS. 1O and 1P, the sixth insulating layer 116 and the third redistribution patterns 133 may be planarized. The planarization process may be performed by a chemical mechanical polishing (CMP) method or a mechanical method. The planarization process may include removing the sixth insulating layer 116 disposed on the third redistribution patterns 133 to expose the surfaces 133a of the third redistribution patterns 133, and planarizing the exposed surfaces 133a of the third redistribution patterns 133. A surface 116a of the sixth insulating layer 116 may also be planarized during the planarization of the exposed surfaces 133a of the third redistribution patterns 133. The surface 116a of the sixth insulating layer 116 may correspond to a top surface of the sixth insulating layer 116. After the planarization process, the surfaces 133a of the third redistribution patterns 133 may be substantially coplanar with the surface 116a of the sixth insulating layer 116. The planarized surfaces 133a of the third redistribution patterns 133 may be substantially flat. For example, the planarized surfaces 133a of the third redistribution patterns 133 may have surface roughnesses of 0.01 µm to 0.4 µm. The sixth insulating layer 116 may be disposed locally between the third redistribution patterns 133.

By the planarization process, the planarized surfaces 133a of the third redistribution patterns 133 may be disposed at substantially the same level. For example, a maximum distance between the bottom surface 111b of the first insulating layer 111 and the surfaces 133a of the third redistribution patterns 133 may range from 100% to 120% of a minimum distance between the bottom surface 111b of the first insulating layer 111 and the surfaces 133a of the third redistribution patterns 133.

The third interconnection portion 133W of each of the third redistribution patterns 133 may have a relatively or substantially uniform width. For example, a width of the third interconnection portion 133W at the surface 133a of one of the third redistribution patterns 133 (i.e., at one surface of the third interconnection portion 133W) may range from 100% to 120% of a width of the third interconnection portion 133W at another surface 133b of the third interconnection portion 133W. The other surface 133b of the third interconnection portion 133W may be opposite to the surface 133a of the third redistribution pattern 133. The other surface 133b of the third interconnection portion 133W may contact the third seed layer 123. Thus, the third redistribution patterns 133 may have a fine pitch. For example, a distance between the third interconnection portions 133W may range from 0.1 µm to 10 µm, in particular, from 0.1 µm to 5 µm. A minimum width of the third interconnection portions 133W may range from 0.1 µm to 10 µm, in particular, from 0.1 µm to 5 µm.

Figure 1Q:
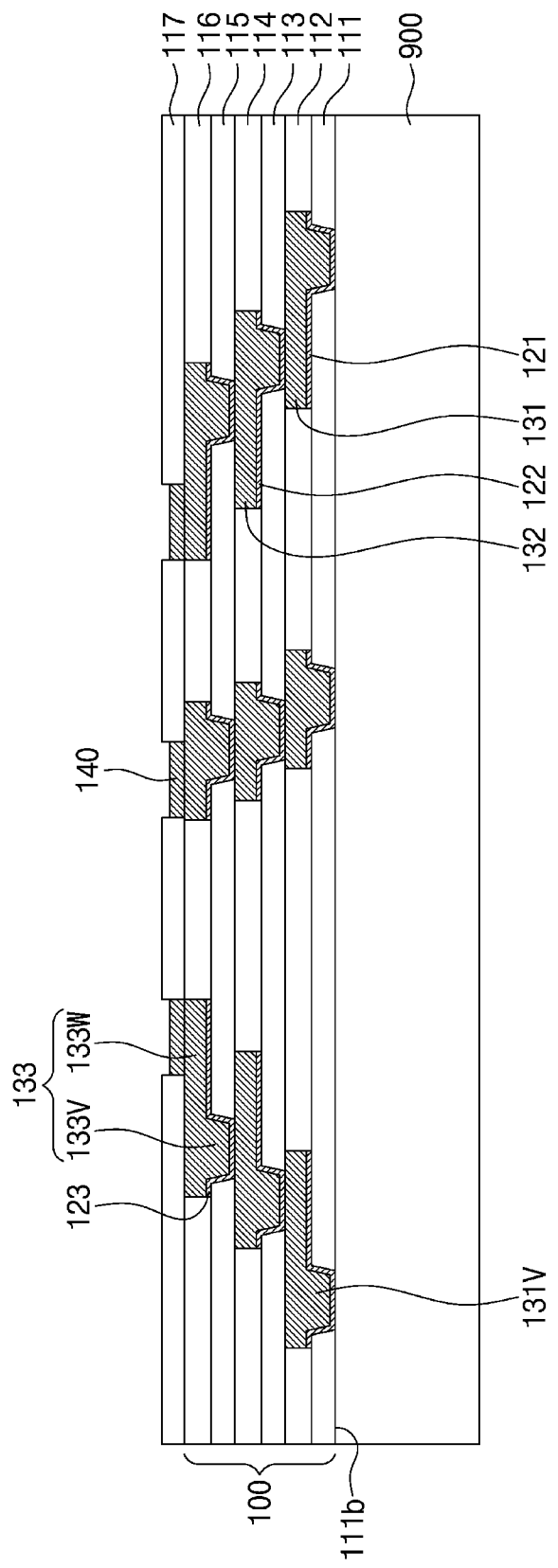

The planarization process of the third redistribution patterns 133 and the sixth insulating layer 116 may be completed to fabricate a redistribution substrate 100. The redistribution substrate 100 may include the first to sixth insulating layers 111, 112, 113, 114, 115 and 116, the first to third seed layers 121, 122 and 123, and the first to third redistribution patterns 131, 132 and 133. However, embodiments of the inventive concepts are not limited thereto. In certain embodiments, the number of the insulating layers 111, 112, 113, 114, 115 and 116, the number of the seed layers 121, 122 and 123, and the number of the redistribution patterns 131, 132 and 133 may be variously modified or changed. As discussed above, the redistribution substrate 100 includes different types of openings in different insulating layers—e.g., a first-type opening such as the opening in insulating layers 111, 113, and 115, where a via portion of a redistribution pattern is formed, and a second-type opening such as the opening in insulating layers 112, 114, and 116, where a redistribution portion of a redistribution pattern is formed. The first-type openings in the insulating layers where the via portions are formed may have relatively tapered sidewall shapes (so that the via portions have relatively tapered sidewalls) compared to the second-type openings in the insulating layers where the redistribution patterns are formed, which may have relatively vertical sidewalls compared to the tapered sidewalls of the first-type openings. Referring to FIG. 1Q, a protective layer 117 may be formed to cover the surfaces 133a of the third redistribution patterns 133 and the surface 116a of the sixth insulating layer 116. The protective layer 117 may include an insulating polymer. The redistribution substrate 100 may further include the protective layer 117. The protective layer 117 may expose at least portions of the surfaces 133a of the third redistribution patterns 133.

Conductive pads 140 may be formed on the exposed portions of the surfaces 133a of the third redistribution patterns 133 and may be electrically connected to the third redistribution patterns 133, respectively. The surfaces 133a of the third redistribution patterns 133 may have the small surface roughnesses, and thus contact resistances between the third redistribution patterns 133 and the conductive pads 140 may be reduced. The conductive pads 140 may include a metal such as copper and/or aluminum. At least one of the conductive pads 140 may not be aligned with the first via portion 131V of the first redistribution pattern 131, electrically connected thereto, in a vertical direction. The vertical direction may be a direction vertical to the bottom surface 111b of the first insulating layer 111. The conductive pads 140 may serve as or may form part of interconnection terminals that electrically connect the redistribution substrate 100 to a semiconductor chip. The conductive pads 140 may, for example, have a substantially flat surface exposed to an outside of the redistribution substrate 100. The conductive pads 140 may be referred to as redistribution substrate pads.

Figure 1R:
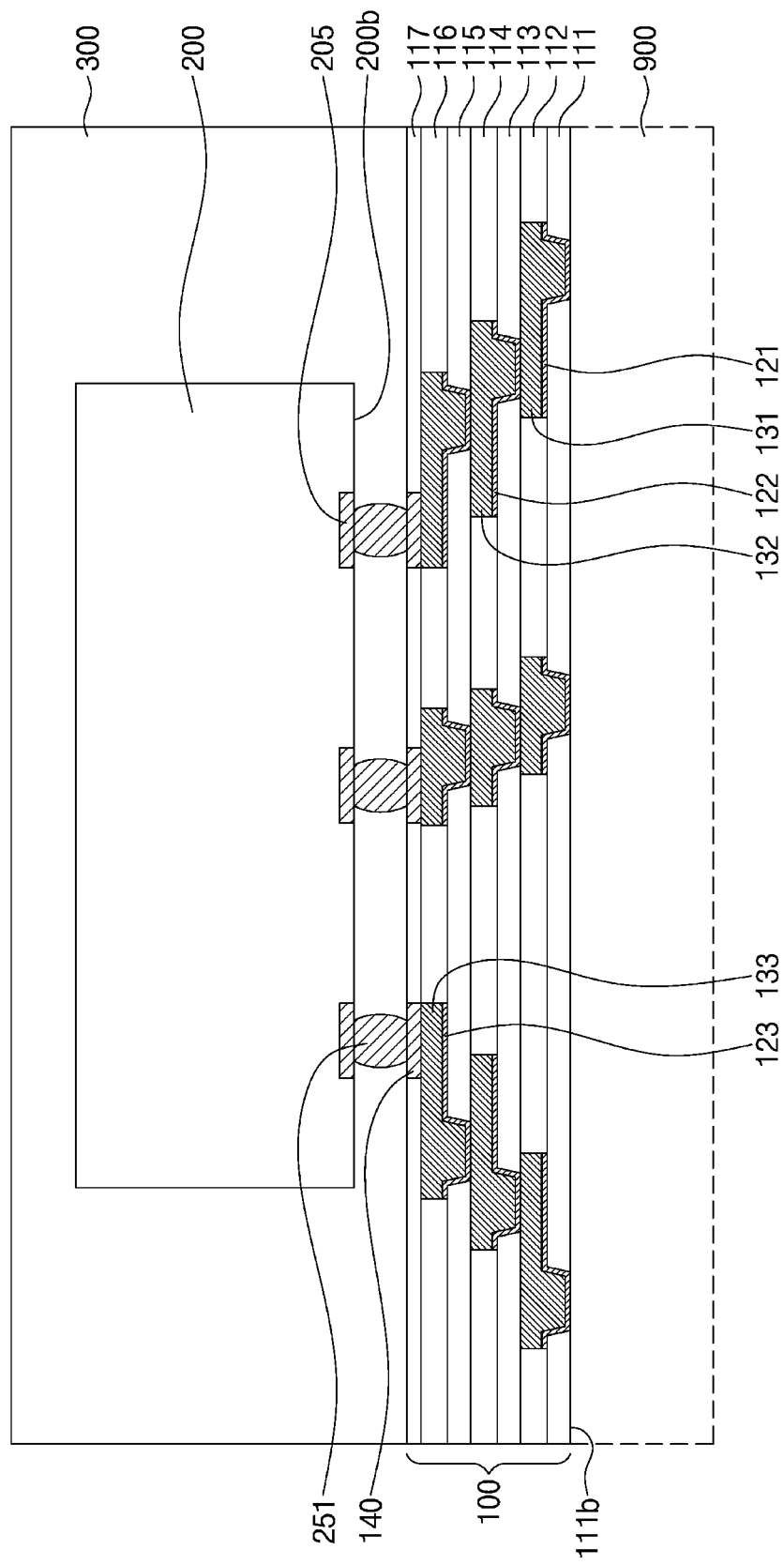

Referring to FIG. 1R, a semiconductor chip 200 may be provided on the redistribution substrate 100, for example, on the protective layer 117. The semiconductor chip 200 may include a semiconductor substrate, integrated circuits on the semiconductor substrate, interconnection lines connected to the integrated circuits, and chip pads 205 connected to the interconnection lines. The chip pads 205 may be provided on a surface 200b of the semiconductor chip 200. The surface 200b of the semiconductor chip 200 may correspond to a bottom surface of the semiconductor chip 200. The chip pads 205 may include a metal such as aluminum. The chip pads 205 may be electrically connected to the integrated circuits of the semiconductor chip 200 through the interconnection lines. In the present specification, it may be understood that when a component is referred to as being "electrically connected" to another component, it may be physically connected directly to the other component or intervening components may be present, so long as an electrical signal path extends between the two components. The integrated circuits of the semiconductor chip 200 may include transistors.

The semiconductor chip 200 may be disposed on the redistribution substrate 100 in such a way that the chip pads 205 of the semiconductor chip 200 face the redistribution substrate 100. A first connection part 251 may be provided between one of the conductive pads 140 and one of the chip pads 205 so as to be electrically connected to the chip pad 205 and the conductive pad 140. The semiconductor chip 200 may be electrically connected to the redistribution substrate 100 through the first connection part 251. In the present specification, it may be understood that when a component is referred to as being electrically connected to the redistribution substrate 100, it may be electrically connected to at least one of the first to third redistribution patterns 131, 132 and 133. The first connection part 251 may include at least one of solder, a pillar, or a bump. The first connection part 251 may include a conductive material such as a metal, and may be described as an interconnection terminal. Though one semiconductor chip 200 is shown, a plurality of semiconductor chips may be stacked on each other and connected to the redistribution substrate 100, where the semiconductor chip 200 depicted is the bottom semiconductor chip in the stack.

A molding layer 300 may be formed on the redistribution substrate 100 to cover the semiconductor chip 200. The molding layer 300 may cover the protective layer 117. The molding layer 300 may extend into a gap between the semiconductor chip 200 and the protective layer 117 to surround or seal the first connection part 251. The molding layer 300 may include an insulating polymer such as an epoxy molding compound (EMC). In certain embodiments, an underfill pattern (not shown) may be provided in the gap between the redistribution substrate 100 and the semiconductor chip 200. Thereafter, the carrier substrate 900 may be removed to expose a bottom surface of the redistribution substrate 100, for example, the first insulating layer 111. At this time, a portion of the first seed layer 121 may also be exposed.

Figure 1S:
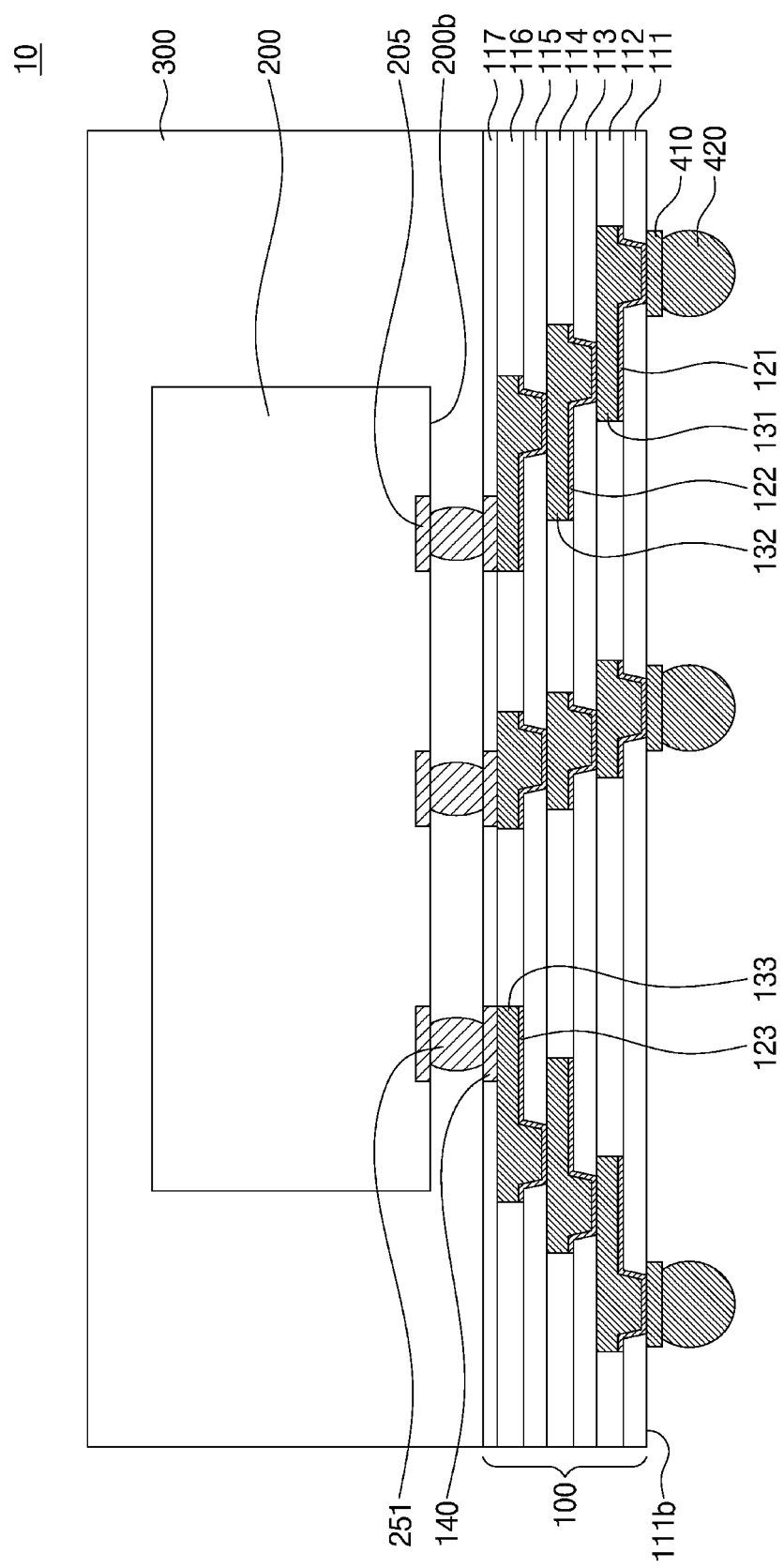

Referring to FIG. 1S, a terminal pad 410 and an external connection terminal 420 may be formed on the bottom surface of the redistribution substrate 100. The external connection terminal 420 may be formed on the exposed portion of the first seed layer 121. The terminal pad 410 may be disposed between the external connection terminal 420 and the exposed portion of the first seed layer 121 to electrically connect the first redistribution pattern 131 and the external connection terminal 420. The terminal pad 410 may include a conductive material such as a metal. The external connection terminal 420 may be electrically connected to the chip pad 205 through the terminal pad 410 and the redistribution patterns 131, 132 and 133. The external connection terminal 420 may not overlap with the chip pad 205 when viewed in a plan view. In other words, the external connection terminal 420 may not be aligned with the chip pad 205 in the vertical direction. The external connection terminal 420 may be provided in plurality, and at least one of the external connection terminals 420 may overlap with the molding layer 300 when viewed in a plan view. The external connection terminal 420 may include a conductive material such as a metal. The external connection terminal 420 may include at least one of solder, a pillar, or a bump. The combination of a terminal pad 410 with an external connection terminal 420 may also be referred to as an external connection terminal, which passes signals between a device external to the semiconductor package 10 and the semiconductor chip 200 of the semiconductor package 10. The terminal pads 410 may also be referred to as external connection pads. The fabrication of a semiconductor package 10 may be completed by the fabricating method according to the aforementioned embodiments of the inventive concepts. The semiconductor package 10 may be a fan-out semiconductor package.

Figure 2A:
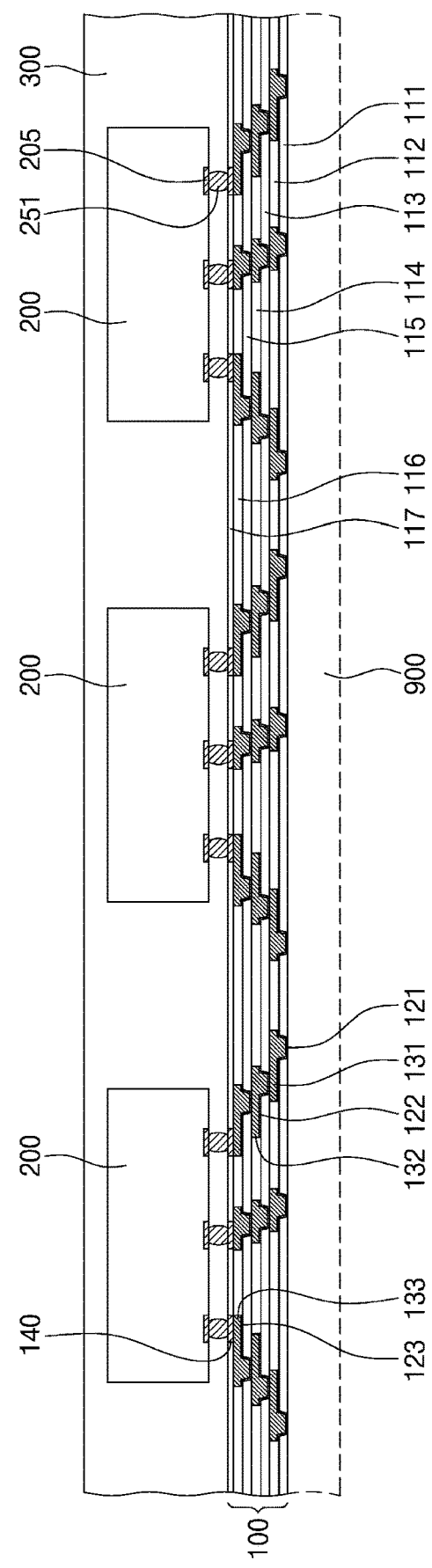
FIGS. 2A and 2B are cross-sectional views illustrating a method of fabricating a semiconductor package, according to some embodiments of the inventive concepts.
Figure 2B:
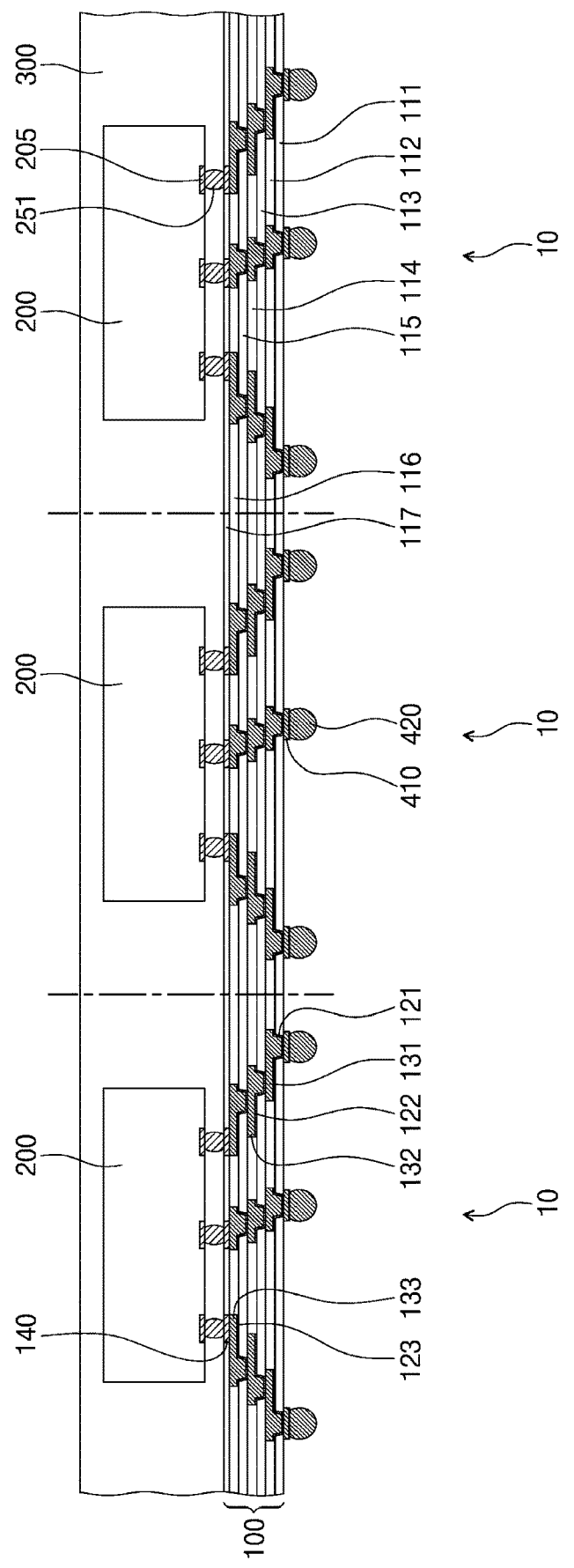

FIGS. 2A and 2B are cross-sectional views illustrating a method of fabricating a semiconductor package, according to some embodiments of the inventive concepts. Hereinafter, the descriptions to the same components and/or features as in the above embodiments will be omitted or mentioned briefly for the purpose of ease and convenience in explanation.

Referring to FIG. 2A, a redistribution substrate 100 may be formed on a carrier substrate 900. The redistribution substrate 100 may include first to sixth insulating layers 111, 112, 113, 114, 115 and 116, first to third redistribution patterns 131, 132 and 133, first to third seed layers 121, 122 and 123, and a protective layer 117. The method of forming the redistribution substrate 100 may be substantially the same as described above with reference to FIGS. 1A to 1Q. However, the redistribution substrate 100 may be formed in a panel level or a wafer level. Conductive pads 140 may be formed on a top surface of the redistribution substrate 100 so as to be connected to the third redistribution patterns 133, respectively.

A semiconductor chip 200 may be provided on the redistribution substrate 100 in such a way that chip pads 205 of the semiconductor chip 200 face the redistribution substrate 100. A first connection part 251 may be formed between one of the conductive pads 140 and one of the chip pads 205. At this time, the semiconductor chip 200 may be provided in plurality on the redistribution substrate 100. A molding layer 300 may be provided on a top surface of the redistribution substrate 100 to cover the semiconductor chips 200. Thereafter, the carrier substrate 900 may be removed to expose the first insulating layer 111 and the first seed layer 121.

Referring to FIG. 2B, terminal pads 410 and external connection terminals 420 may be formed on an exposed bottom surface of the redistribution substrate 100. Each of the terminal pads 410 may be disposed between each of the external connection terminals 420 and the first seed layer 121 to electrically connect the external connection terminal 420 and the first redistribution pattern 131.

The molding layer 300 and the redistribution substrate 100 may be sawed along one-dot chain lines to separate semiconductor packages 10 from each other. In the present specification, the semiconductor packages 10 may be fabricated in a chip level, a panel level, or a wafer level. Hereinafter, a single semiconductor package 10 will be described and illustrated for the purpose of ease and convenience in explanation. However, embodiments of the inventive concepts are not limited to the fabrication of a semiconductor package in the chip level.

Figure 3:
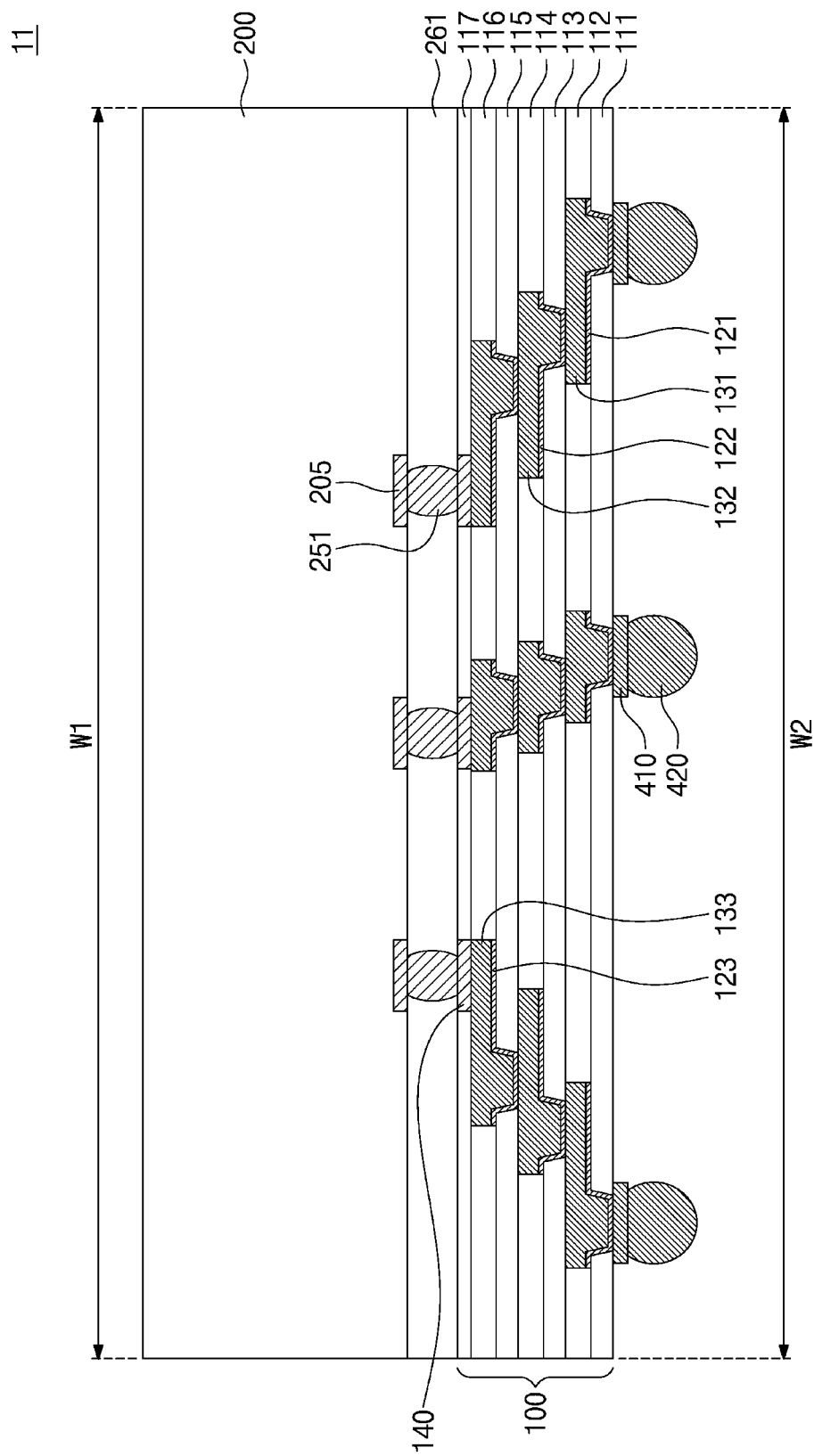
FIG. 3 is a cross-sectional view illustrating a semiconductor package according to some embodiments of the inventive concepts.

FIG. 3 is a cross-sectional view illustrating a semiconductor package according to some embodiments of the inventive concepts. Hereinafter, the descriptions to the same components and/or features as in the above embodiments will be omitted or mentioned briefly for the purpose of ease and convenience in explanation.

Referring to FIG. 3, a semiconductor package 11 may include a redistribution substrate 100 and a semiconductor chip 200. A first connection part 251 may be disposed between the redistribution substrate 100 and the semiconductor chip 200 to connect the chip pad 205 of the semiconductor chip 200 and the third redistribution pattern 133 of the redistribution substrate 100. However, the molding layer 300 may be omitted unlike the semiconductor package 10 of FIG. 1S. A width W1 of the semiconductor chip 200 may be substantially equal to a width W2 of the redistribution substrate 100. The semiconductor package 11 may be a fan-in semiconductor package. The method of forming the redistribution substrate 100 may be substantially the same as described above with reference to FIGS. 1A to 1Q.

FIGS. 4A to 4F are cross-sectional views illustrating a method of fabricating a semiconductor package, according to some embodiments of the inventive concepts. In descriptions of FIGS. 4A to 4F, a top surface, a bottom surface, an upper portion and a lower portion will be described based on FIG. 4F for the purpose of convenience and consistency in description.

Figure 4A:
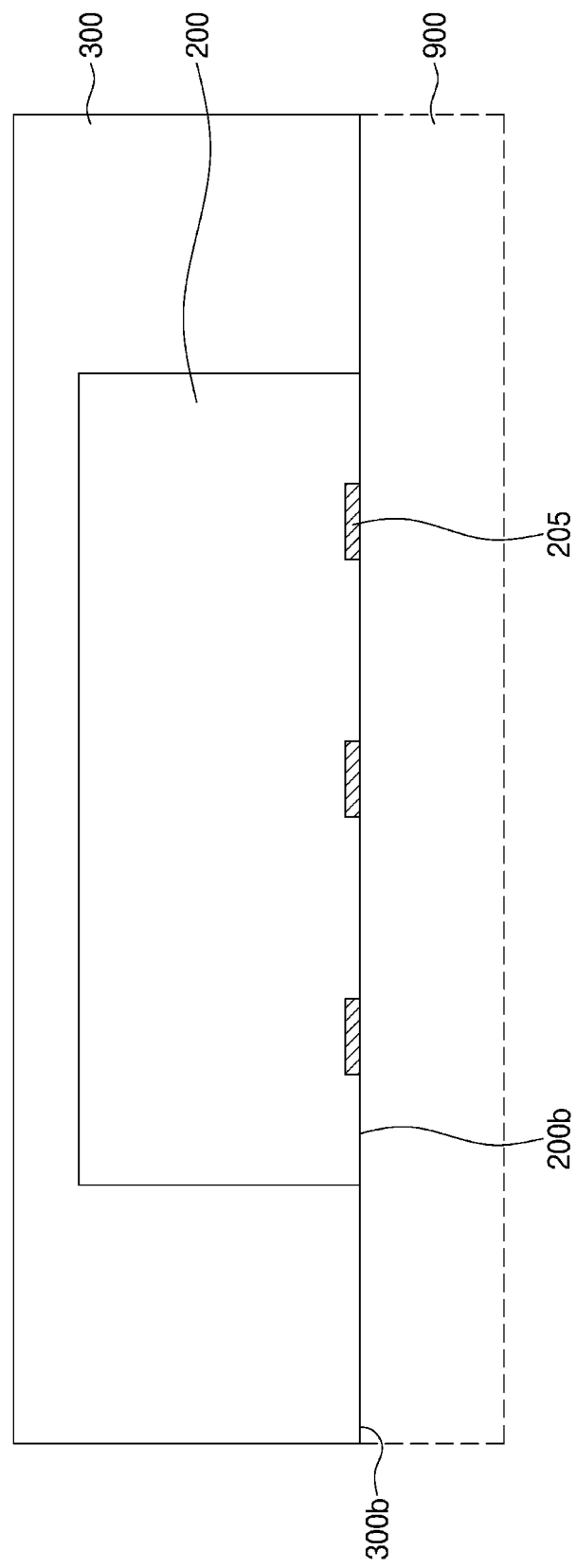

Referring to FIG. 4A, a semiconductor chip 200 and a molding layer 300 are disposed on a carrier substrate 900. A surface 200b of the semiconductor chip 200 faces the carrier substrate 900. Chip pads 205 are provided on the surface 200b of the semiconductor chip 200. The molding layer 300 may be formed on the carrier substrate 900 to cover at least a portion of the semiconductor chip 200. In some embodiments, the molding layer 300 may cover a top surface and a sidewall of the semiconductor chip 200. Unlike FIG. 4A, the molding layer 300 may cover the sidewall of the semiconductor chip 200 but may expose the top surface of the semiconductor chip 200. The carrier substrate 900 may be removed to expose the surface 200b of the semiconductor chip 200 and a surface 300b of the molding layer 300. Thereafter, the semiconductor chip 200 and the molding layer 300 may be turned over (e.g., flipped).

Figure 4B:
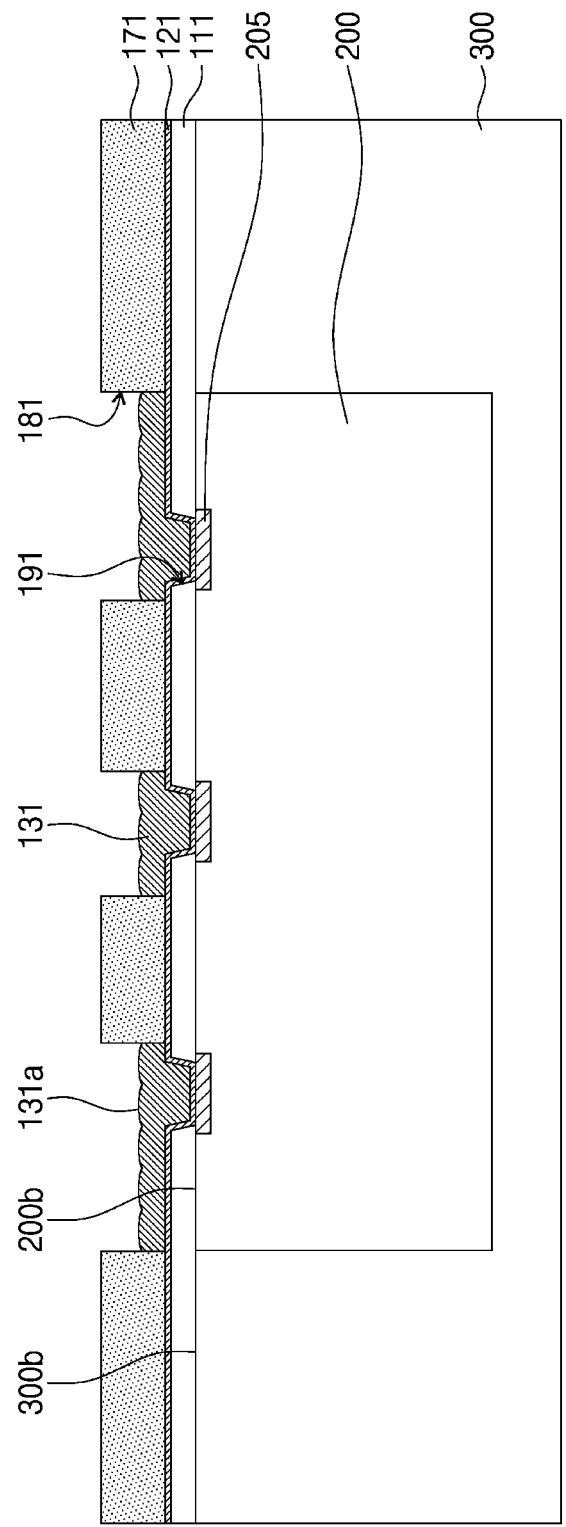

Referring to FIG. 4B, a first insulating layer 111, a first seed layer 121, a first resist pattern 171, and a first redistribution pattern 131 may be formed on the semiconductor chip 200 and the molding layer 300. The first insulating layer 111 may be provided on a semiconductor substrate of the semiconductor chip 200. The first insulating layer 111 may cover the surface 200b of the semiconductor chip 200 and the surface 300b of the molding layer 300. A first opening 191 may be formed in the first insulating layer 111 to expose the chip pad 205 of the semiconductor chip 200. The first insulating layer 111, the first seed layer 121, the first resist pattern 171, and the first redistribution pattern 131 may be formed by the method described above with reference to FIGS. 1A and 1B. For example, the first redistribution pattern 131 may be formed in the first opening 191 and the first guide opening 181 by the electroplating process using the first seed layer 121 as an electrode. Thereafter, the first resist pattern 171 may be removed to expose the first seed layer 121.

Figure 4C:
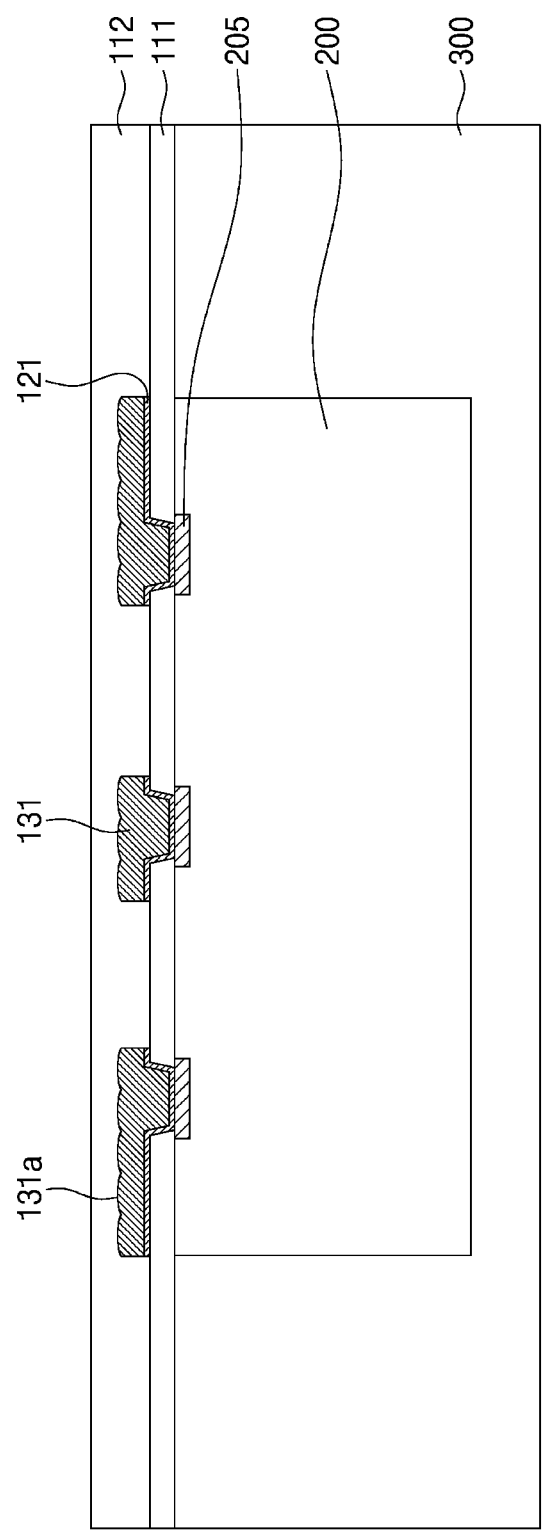

Referring to FIG. 4C, the first seed layer 121 exposed by the first redistribution pattern 131 may be removed to expose the first insulating layer 111. A second insulating layer 112 may be formed on the first insulating layer 111 and the first redistribution pattern 131.

Figure 4D:
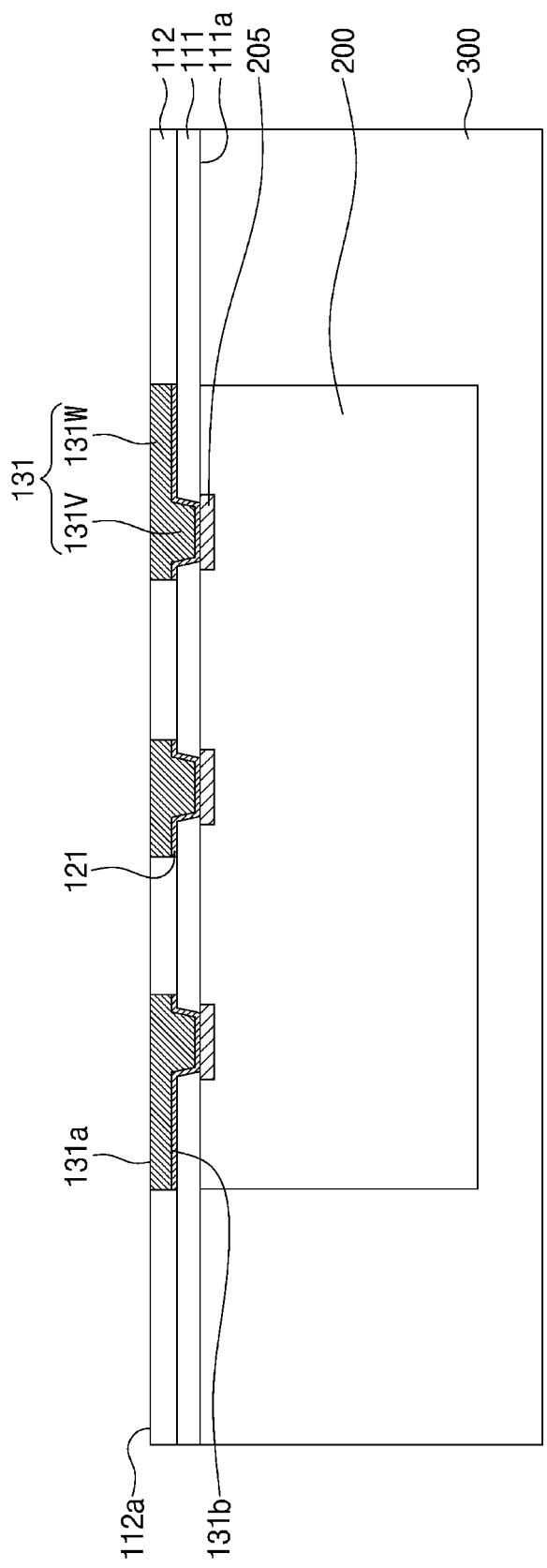

Referring to FIG. 4D, the second insulating layer 112 and the first redistribution pattern 131 may be planarized. The planarization process may be substantially the same as described above with reference to FIGS. 1F and 1G. By the planarization process, the second insulating layer 112 on the first redistribution pattern 131 may be removed to expose a surface 131a of the first redistribution pattern 131, and the exposed surface 131a of the first redistribution pattern 131 may be planarized. A surface 112a of the second insulating layer 112 may also be planarized during the planarization of the exposed surface 131a of the first redistribution pattern 131. The surface 131a of the first redistribution pattern 131 may be substantially coplanar with the surface 112a of the second insulating layer 112. The planarized surface 131a of the first redistribution pattern 131 may have a surface roughness, for example, of 0.01 µm to 0.4 µm. A width of the first interconnection portion 131W at the surface 131a of the first redistribution pattern 131 (i.e., at one surface of the first interconnection portion 131W) may range from 100% to 120% of a width of the first interconnection portion 131W at another surface 131b of the first interconnection portion 131W. A maximum distance between a surface 111a of the first insulating layer 111 and the surfaces 131a of the first redistribution patterns 131 may range from 100% to 120% of a minimum distance between the surface 111a of the first insulating layer 111 and the surfaces 131a of the first redistribution patterns 131.

Figure 4E:
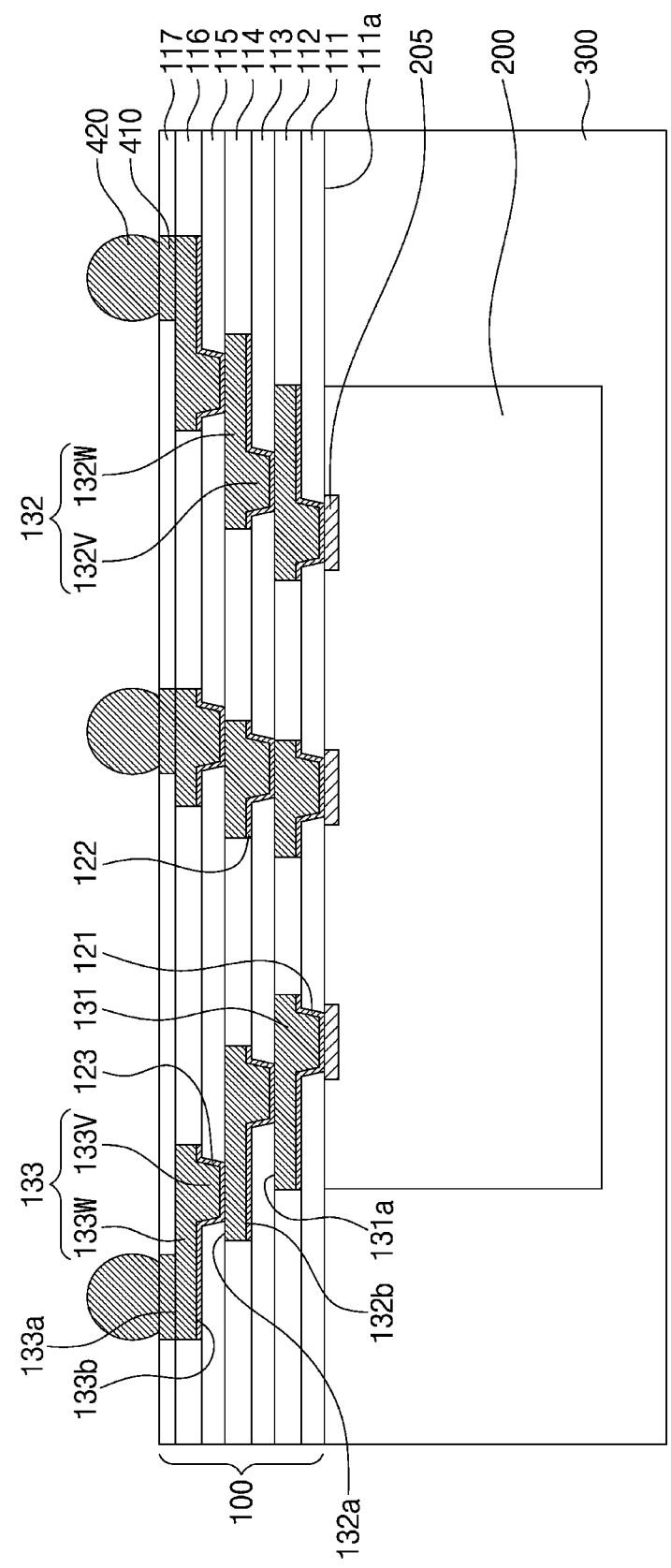

Referring to FIG. 4E, a third insulating layer 113, a second seed layer 122, a second redistribution pattern 132, a fourth insulating layer 114, a fifth insulating layer 115, a third seed layer 123, a third redistribution pattern 133, a sixth insulating layer 116, and a protective layer 117 may be sequentially formed on the second insulating layer 112 and the first redistribution pattern 131. The third insulating layer 113, the second seed layer 122, the second redistribution pattern 132, the fourth insulating layer 114, the fifth insulating layer 115, the third seed layer 123, the third redistribution pattern 133, the sixth insulating layer 116, and the protective layer 117 may be formed by substantially the same method as described above with reference to FIGS. 1H to 1Q. Thus, a redistribution substrate 100 may be fabricated. A width of the second interconnection portion 132W at the surface 132a of the second redistribution pattern 132 (i.e., at one surface of the second interconnection portion 132W) may range from 100% to 120% of a width of the second interconnection portion 132W at another surface 132b of the second interconnection portion 132W. A maximum distance between the surface 111a of the first insulating layer 111 and the surfaces 132a of the second redistribution patterns 132 may range from 100% to 120% of a minimum distance between the surface 111a of the first insulating layer 111 and the surfaces 132a of the second redistribution patterns 132. A width of the third interconnection portion 133W at the surface 133a of the third redistribution pattern 133 (i.e., at one surface of the third interconnection portion 133W) may range from 100% to 120% of a width of the third interconnection portion 133W at another surface 133b of the third interconnection portion 133W. A maximum distance between the surface 111a of the first insulating layer 111 and the surfaces 133a of the third redistribution patterns 133 may range from 100% to 120% of a minimum distance between the surface 111a of the first insulating layer 111 and the surfaces 133a of the third redistribution patterns 133.

A terminal pad 410 may be formed on the third redistribution pattern 133 exposed by the protective layer 117. The terminal pad 410 may include a metal. An external connection terminal 420 may be formed on the terminal pad 410. Thus, a semiconductor package 12 may be fabricated.

Referring to FIG. 4F, the semiconductor package 12 may be turned over. The surface 131a of the first redistribution pattern 131, the surface 132a of the second redistribution pattern 132, and the surface 133a of the third redistribution pattern 133 may correspond to a bottom surface of the first redistribution pattern 131, a bottom surface of the second redistribution pattern 132, and a bottom surface of the third redistribution pattern 133, respectively. The surface 111a of the first insulating layer 111 may correspond to a top surface of the first insulating layer 111. The surface 112a of the second insulating layer 112 may correspond to a bottom surface of the second insulating layer 112.

In certain embodiments, like FIG. 3, the molding layer 300 may be omitted, and a sidewall of the redistribution substrate 100 may be substantially aligned with a sidewall of the semiconductor chip 200. In this case, a width of the redistribution substrate 100 may be substantially equal to a width of the semiconductor chip 200.

Figure 5:
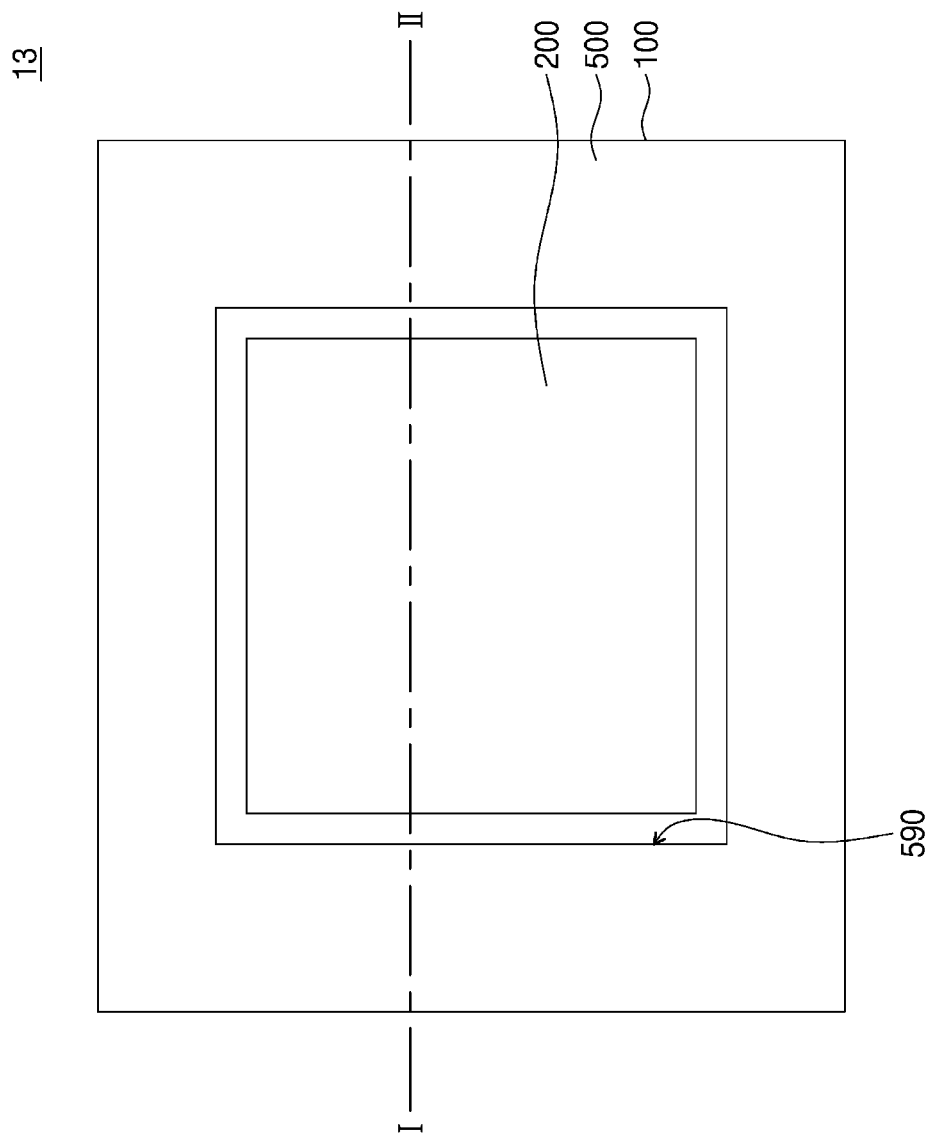
FIG. 5 is a plan view illustrating a semiconductor package according to some embodiments of the inventive concepts.
Figure 6A:
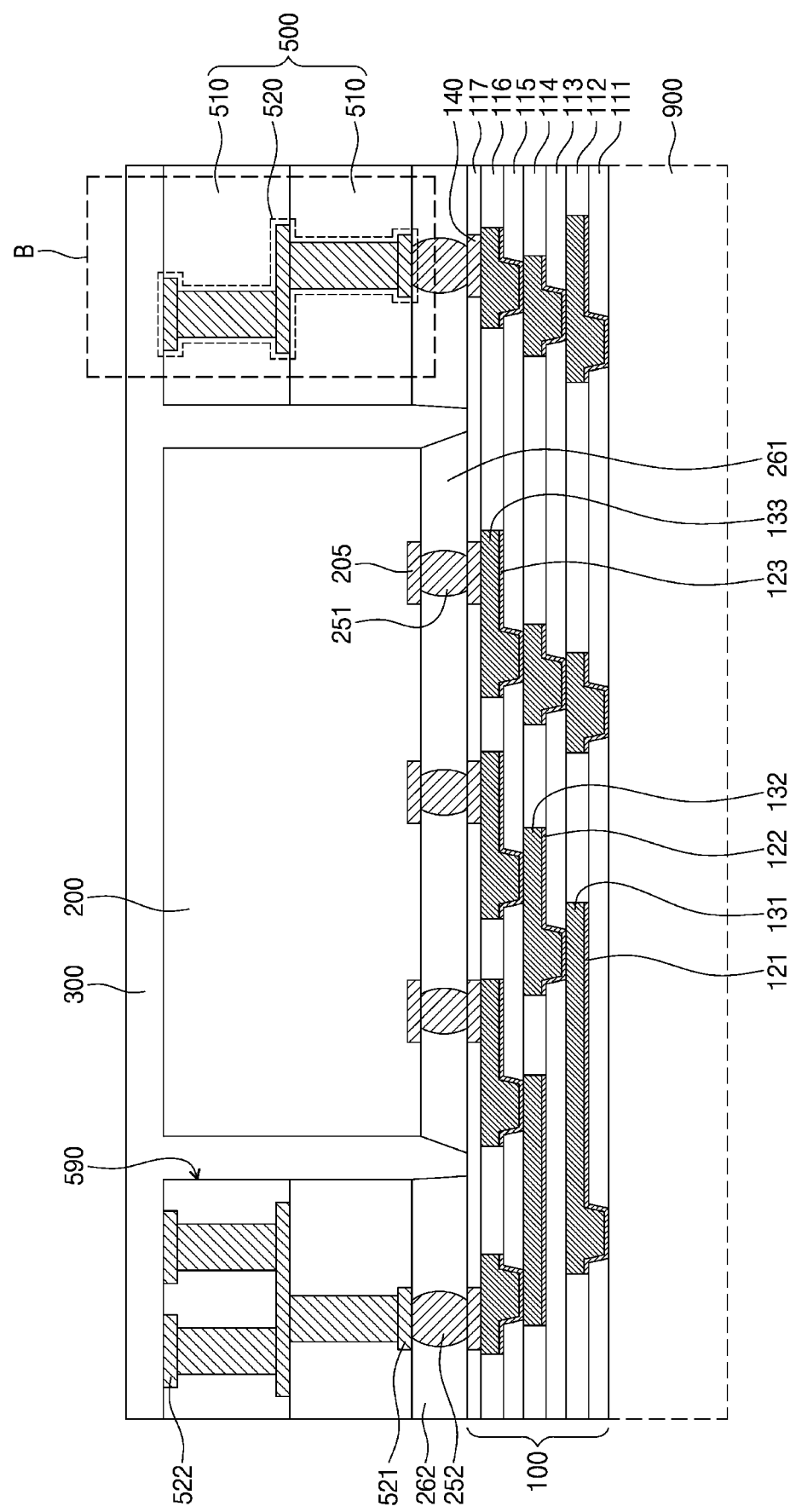
FIGS. 6A and 6C are cross-sectional views taken along a line I-II of FIG. 5 to illustrate a method of fabricating a semiconductor package, according to some embodiments of the inventive concepts.
Figure 6B:
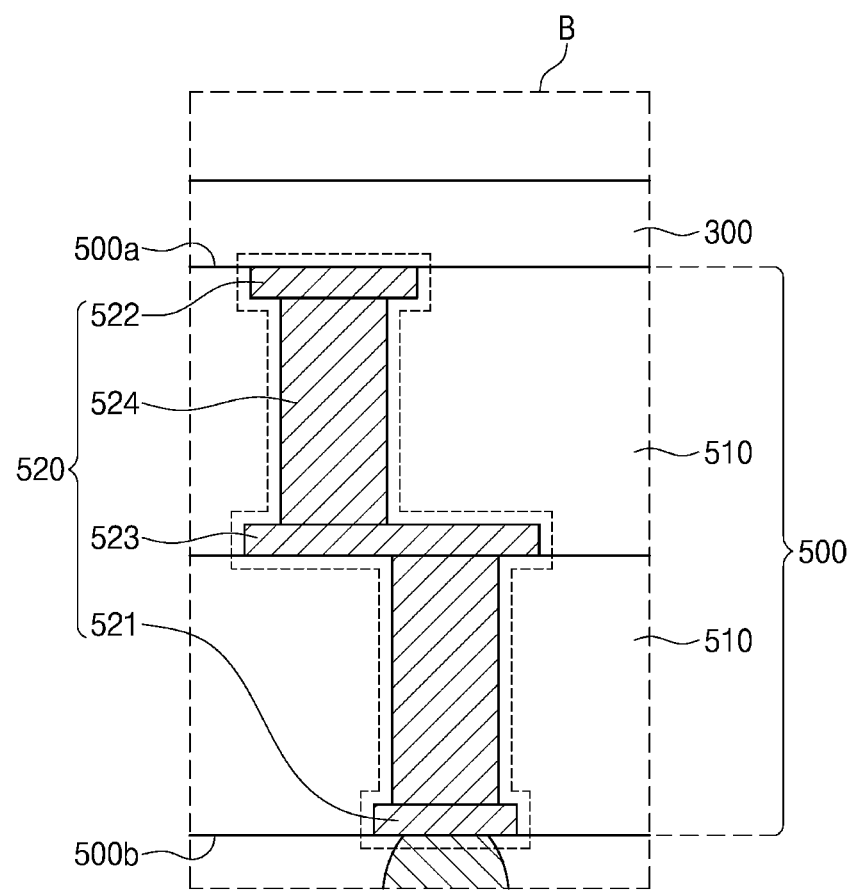
FIG. 6B is an enlarged view of a region 'B' of FIG. 6A.
Figure 6C:
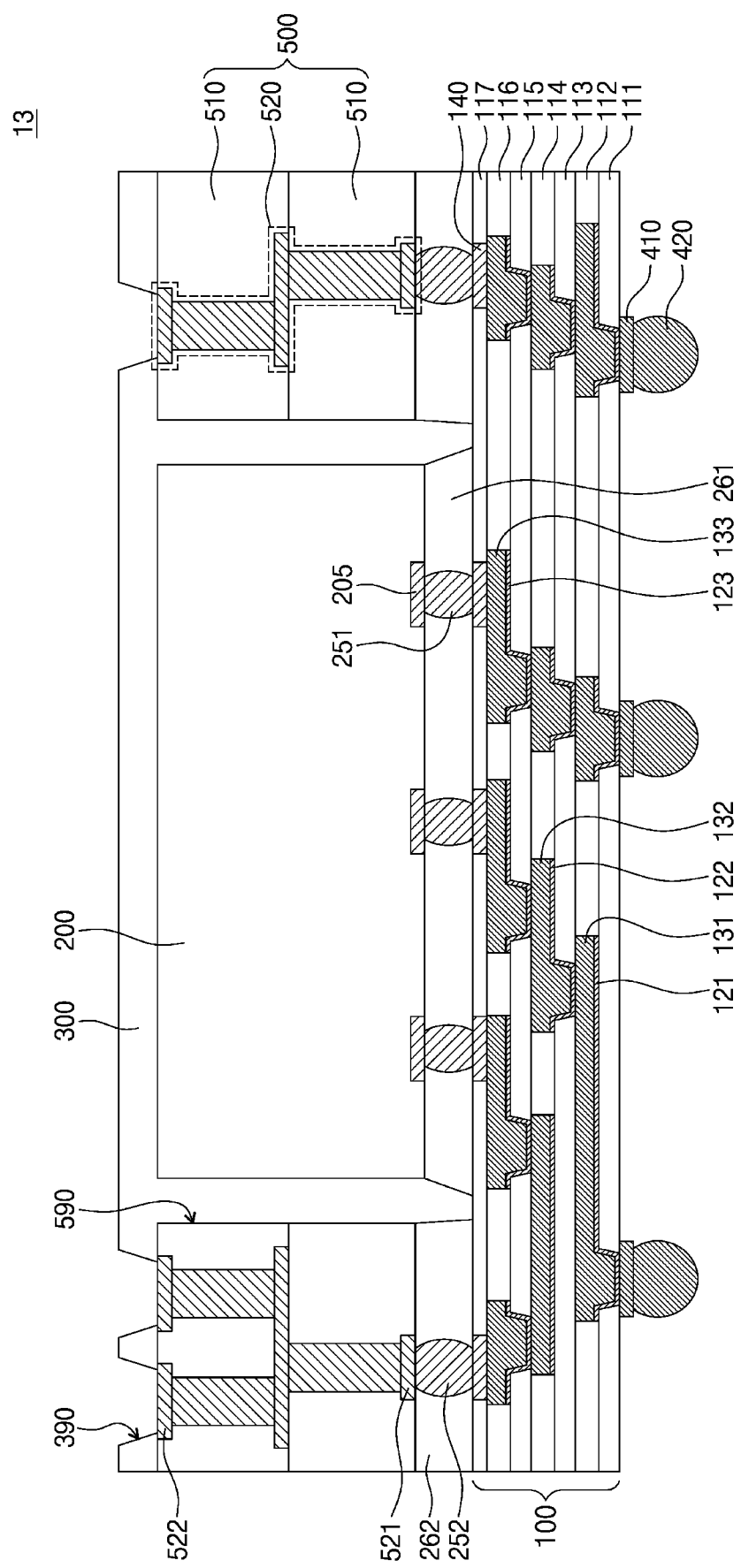

FIG. 5 is a plan view illustrating a semiconductor package according to some embodiments of the inventive concepts. FIGS. 6A and 6C are cross-sectional views taken along a line I-II of FIG. 5 to illustrate a method of fabricating a semiconductor package, according to some embodiments of the inventive concepts. FIG. 6B is an enlarged view of a region 'B' of FIG. 6A.

Referring to FIGS. 5, 6A and 6B, a carrier substrate 900 on which a redistribution substrate 100 is formed may be prepared. The redistribution substrate 100 may be formed by the method described above with reference to FIGS. 1A to 1Q. Conductive pads 140 may be formed on a top surface of the redistribution substrate 100.

A semiconductor chip 200 may be provided on the redistribution substrate 100. The semiconductor chip 200 may be disposed on a central region of the redistribution substrate 100 when viewed in a plan view. A first connection part 251 may be formed between one of the conductive pads 140 and one of the chip pads 205. A first underfill pattern 261 may be formed between the redistribution substrate 100 and the semiconductor chip 200 to surround or seal the first connection part 251.

A connection substrate 500 may be provided on the redistribution substrate 100. The connection substrate 500 may be provided before or after providing the semiconductor chip 200. The connection substrate 500 may have a hole 590 penetrating the connection substrate 500. For example, the hole 590 may be formed in a printed circuit board to fabricate the connection substrate 500. The hole 590 may overlap with the central region of the redistribution substrate 100 when viewed in a plan view. The hole 590 may expose the redistribution substrate 100. The semiconductor chip 200 may be provided in the hole 590 of the connection substrate 500. The connection substrate 500 may include a base layer 510 and a conductive structure 520. The base layer 510 may include a plurality of base layers 510 sequentially stacked. The base layers 510 may include an insulating material. For example, the base layers 510 may include a carbon-based material, a ceramic, or a polymer. The hole 590 may penetrate the base layers 510. The conductive structure 520 may be provided in the base layers 510. As illustrated in FIG. 6B, the conductive structure 520 may include a first pad 521, a conductive interconnection line 523, vias 524, and a second pad 522. The first pad 521 may be provided on a bottom surface 500b of the connection substrate 500. The conductive interconnection line 523 may be disposed between the base layers 510. The vias 524 may penetrate the base layers 510 and may be connected to the conductive interconnection line 523. The second pad 522 may be disposed on a top surface 500a of the connection substrate 500 and may be connected to one of the vias 524. The second pad 522 may be electrically connected to the first pad 521 through the vias 524 and the conductive interconnection line 523. The second pad 522 may not be fully vertically aligned with the first pad 521. The number and/or arrangement of the second pad(s) 522 may be different from the number and/or arrangement of the first pad(s) 521. The conductive structure 520 may include a metal. For example, the conductive structure 520 may include at least one of copper, aluminum, gold, lead, stainless steel, silver, iron, or any alloy thereof.

As illustrated in FIG. 6A, a second connection part 252 may be formed between the first pad 521 and another of the conductive pads 140 to connect the first pad 521 to the other conductive pad 140. The conductive structure 520 may be electrically connected to the redistribution substrate 100 through the second connection part 252. The second connection part 252 may include a conductive material. The second connection part 252 may include at least one of a solder ball, a bump, or a pillar. A second underfill pattern 262 may be formed between the redistribution substrate 100 and the connection substrate 500 to surround or seal the second connection part 252.

The third redistribution pattern 133 may include a plurality of third redistribution patterns 133. One of the third redistribution patterns 133 may be electrically connected to the chip pad 205 through the first connection part 251, and another of the third redistribution patterns 133 may be electrically connected to the first pad 521 through the second connection part 252. The semiconductor chip 200 may be electrically connected to the conductive structure 520 through at least one of the redistribution patterns 131, 132 and 133.

A molding layer 300 may be formed on the semiconductor chip 200 and the connection substrate 500. The molding layer 300 may extend into a gap between the semiconductor chip 200 and the connection substrate 500 to fill the gap. The molding layer 300 may include an insulating polymer such as an epoxy-based polymer. In certain embodiments, an adhesive insulating film may be adhered onto the connection substrate 500 and the semiconductor chip 200 to form the molding layer 300. For example, the Ajinomoto build-up film (ABF) may be used as the adhesive insulating film. In certain embodiments, the first underfill pattern 261 may be omitted, the molding layer 300 may further extend into a gap between the redistribution substrate 100 and the semiconductor chip 200. In certain embodiments, the second underfill pattern 262 may be omitted, the molding layer 300 may further extend into a gap between the redistribution substrate 100 and the connection substrate 500. Thereafter, the carrier substrate 900 may be removed to expose a bottom surface of the redistribution substrate 100. For example, the first insulating layer 111 and the first seed layer 121 may be exposed.

Referring to FIG. 6C, a terminal pad 410 and an external connection terminal 420 may be formed on the bottom surface of the redistribution substrate 100. The terminal pad 410 may be formed on the first seed layer 121 exposed by the first insulating layer 111. The external connection terminal 420 may be electrically connected to the semiconductor chip 200 or the conductive structure 520 through the redistribution patterns 131, 132 and 133. An upper hole 390 may be formed in the molding layer 300 to expose the second pad 522 of the conductive structure 520. Thus, a semiconductor package 13 may be fabricated.

Figure 6D:
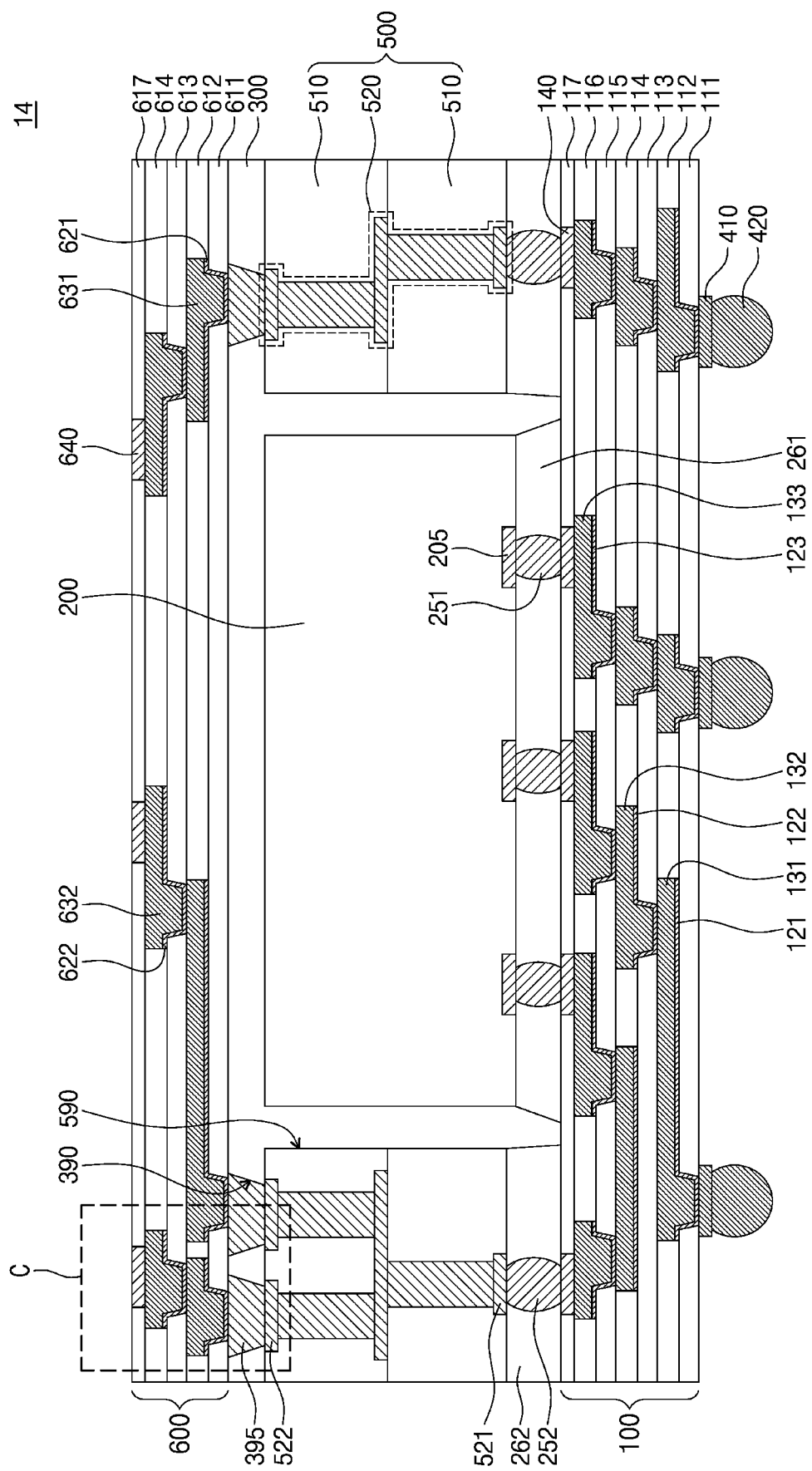
FIG. 6D is a cross-sectional view illustrating a semiconductor package according to some embodiments of the inventive concepts.
Figure 6E:
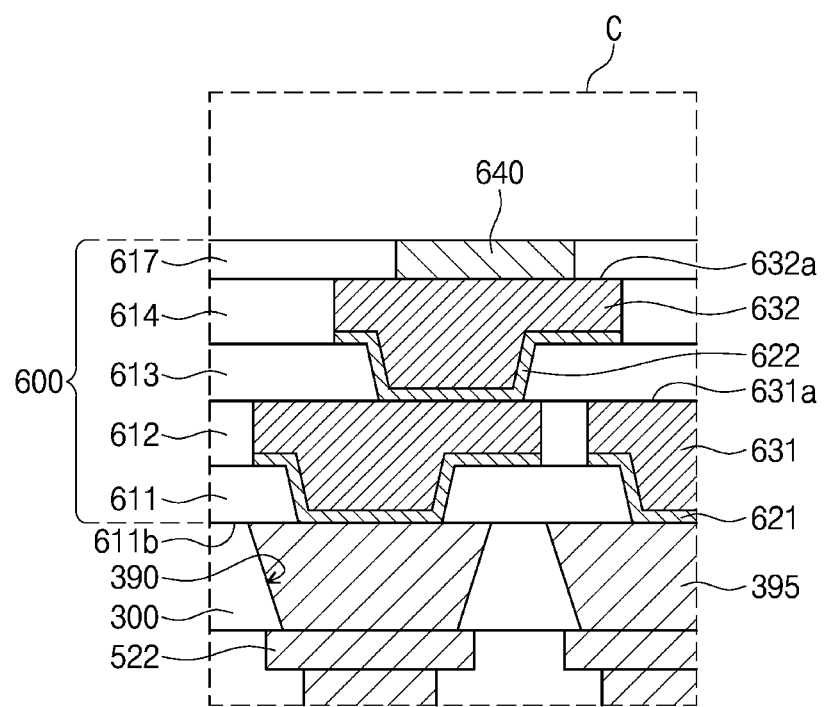
FIG. 6E is an enlarged view of a region 'C' of FIG. 6D.

FIG. 6D is a cross-sectional view corresponding to the line I-II of FIG. 5 to illustrate a semiconductor package according to some embodiments of the inventive concepts. FIG. 6E is an enlarged view of a region 'C' of FIG. 6D.

Referring to FIGS. 5, 6D and 6E, a semiconductor package 14 may include the redistribution substrate 100, the semiconductor chip 200, the connection substrate 500, the molding layer 300, and an upper redistribution layer 600. Formation of the redistribution substrate 100, disposing of the connection substrate 500, providing of the semiconductor chip 200, and formation of the molding layer 300 may be performed by substantially the same method as described above with reference to FIGS. 6A to 6C. In some embodiments, a conductive portion 395 may be formed in the upper hole 390 and may fill the upper hole 390. The conductive portion 395 may include, for example, a metal.

The upper redistribution layer 600 may be provided on a top surface of the molding layer 300. The upper redistribution layer 600 may include first to fourth upper insulating layers 611, 612, 613 and 614, a first upper seed layer 621, a second upper seed layer 622, a first upper redistribution pattern 631, a second upper redistribution pattern 632, and an upper protective layer 617.

The first upper insulating layer 611 may be provided on the molding layer 300. The first upper insulating layer 611 may include a photosensitive polymer. The first upper insulating layer 611 may have an upper opening which exposes the conductive portion 395. The first upper redistribution pattern 631 may be provided on the first upper insulating layer 611 and in the upper opening. The first upper redistribution pattern 631 may include a metal such as copper. The first upper seed layer 621 may be disposed between the first upper redistribution pattern 631 and the first upper insulating layer 611 and between the first upper redistribution pattern 631 and the conductive portion 395. The first upper redistribution pattern 631 may be electrically connected to the conductive portion 395 through the first upper seed layer 621.

The second upper insulating layer 612 may be provided on the first upper insulating layer 611. The second upper insulating layer 612 may contact a sidewall of the first upper redistribution pattern 631. The first upper seed layer 621 may not extend between the first upper redistribution pattern 631 and the second upper insulating layer 612.

The first upper insulating layer 611, the first upper seed layer 621, the first upper redistribution pattern 631, the second upper insulating layer 612, the third upper insulating layer 613, the second upper seed layer 622, the second upper redistribution pattern 632, and the fourth upper insulating layer 614 may be formed by substantially the same methods as the first insulating layer 111, the first seed layer 121, the first redistribution pattern 131, the second insulating layer 112, the third insulating layer 113, the second seed layer 122, the second redistribution pattern 132, and the fourth insulating layer 114 described above with reference to FIGS. 1A to 1L. For example, a planarization process may be performed on a top surface 631a of the first upper redistribution pattern 631 and a top surface of the second upper insulating layer 612. Thus, the top surface 631a of the first upper redistribution pattern 631 may be substantially coplanar with the top surface of the second upper insulating layer 612. The top surface 631a of the first upper redistribution pattern 631 may have a surface roughness, for example, of 0.01 µm to 0.4 µm. The first upper redistribution pattern 631 may be provided in plurality. A maximum distance between a bottom surface 611b of the first upper insulating layer 611 and the top surfaces 631a of the first upper redistribution patterns 631 may range from 100% to 120% of a minimum distance between the bottom surface 611b of the first upper insulating layer 611 and the top surfaces 631a of the first upper redistribution patterns 631.

Likewise, a planarization process may be performed on a top surface 632a of the second upper redistribution pattern 632 and a top surface of the fourth upper insulating layer 614. Thus, the top surface 632a of the second upper redistribution pattern 632 may be substantially coplanar with the top surface of the fourth upper insulating layer 614. The top surface 632a of the second upper redistribution pattern 632 may have a surface roughness, for example, of 0.01 µm to 0.4 µm. A maximum distance between the bottom surface 611b of the first upper insulating layer 611 and the top surfaces 632a of the second upper redistribution patterns 632 may range from 100% to 120% of a minimum distance between the bottom surface 611b of the first upper insulating layer 611 and the top surfaces 632a of the second upper redistribution patterns 632. The second upper seed layer 622 may be disposed between the second upper redistribution pattern 632 and the second upper insulating layer 612. The second upper seed layer 622 may not extend between the second upper redistribution pattern 632 and the fourth upper insulating layer 614.

The upper protective layer 617 may be formed on the fourth upper insulating layer 614 to cover at least a portion of the top surface 632a of the second upper redistribution pattern 632. The upper protective layer 617 may include an insulating polymer.

An upper conductive pad 640 may be formed on the top surface 632a of the second upper redistribution pattern 632 so as to be connected to the second upper redistribution pattern 632. The upper conductive pad 640 may be electrically connected to the conductive structure 520 through the first and second upper redistribution patterns 631 and 632 and the conductive portion 395. The upper conductive pad 640 may not be vertically aligned with the conductive portion 395.

Figure 6F:
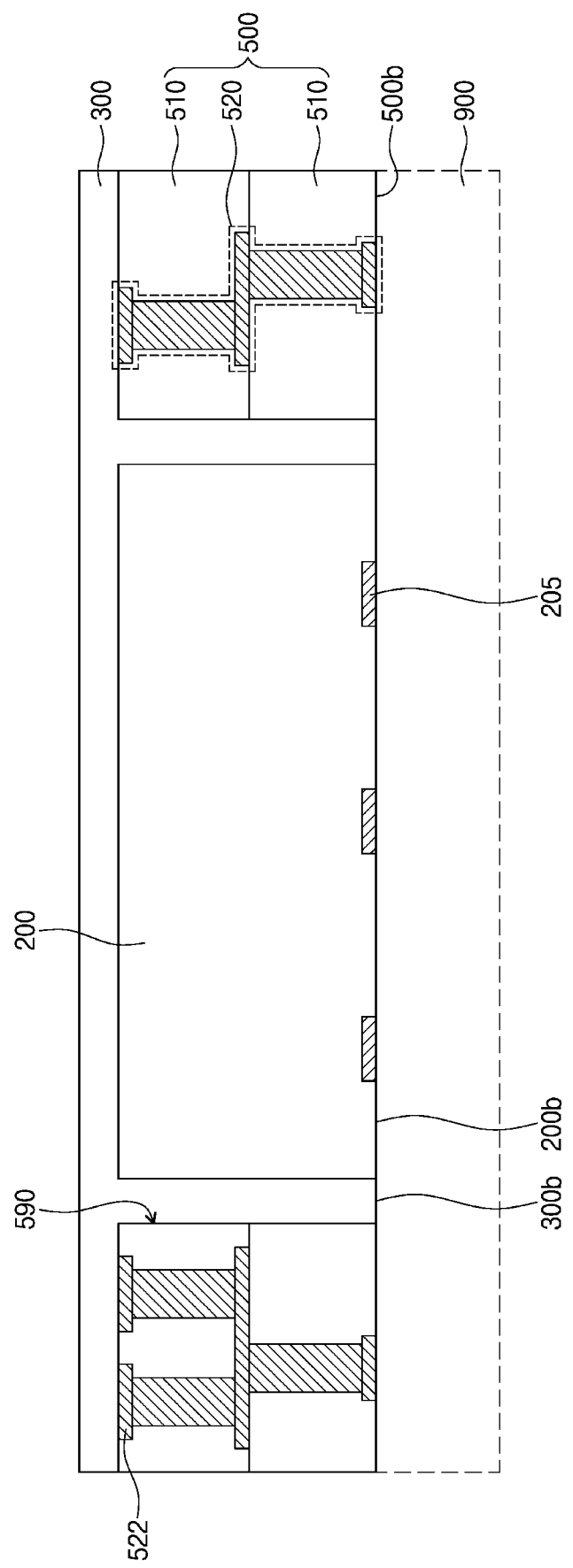

FIGS. 6F and 6G are cross-sectional views corresponding to the line I-II of FIG. 5 to illustrate a method of fabricating a semiconductor package, according to some embodiments of the inventive concepts.

Referring to FIGS. 5 and 6F, a connection substrate 500 may be disposed on a carrier substrate 900. The connection substrate 500 may be substantially the same as described with reference to FIGS. 5, 6A and 6B. A semiconductor chip 200 may be provided on the carrier substrate 900 in such a way that a chip pad 205 of the semiconductor chip 200 faces the carrier substrate 900. The semiconductor chip 200 may be disposed on a central region of the carrier substrate 900 when viewed in a plan view. The semiconductor chip 200 may be provided in the hole 590 of the connection substrate 500. The semiconductor chip 200 may be provided before or after disposing the connection substrate 500. A molding layer 300 may be formed on the semiconductor chip 200 and the connection substrate 500. The molding layer 300 may fill a gap between the semiconductor chip 200 and the connection substrate 500. Thereafter, the carrier substrate 900 may be removed to expose a surface 200b of the semiconductor chip 200, a surface 300b of the molding layer 300, and a bottom surface 500b of the connection substrate 500.

Referring to FIGS. 5 and 6G, a first insulating layer 111, a first seed layer 121, a first redistribution pattern 131, a second insulating layer 112, a third insulating layer 113, a second seed layer 122, a second redistribution pattern 132, a fourth insulating layer 114, a fifth insulating layer 115, a third seed layer 123, a third redistribution pattern 133, and a sixth insulating layer 116 may be sequentially formed on the surface 200b of the semiconductor chip 200 and the surface 300b of the molding layer 300 to fabricate a redistribution substrate 100. The redistribution substrate 100 may be fabricated by substantially the same method as described above with reference to FIGS. 4A to 4E. However, the redistribution substrate 100 may further extend onto the bottom surface 500b of the connection substrate 500. The first insulating layer 111 may cover the surface 200b of the semiconductor chip 200, the surface 300b of the molding layer 300, and the bottom surface 500b of the connection substrate 500. One of the first redistribution patterns 131 may be electrically connected to the chip pad 205, and another of the first redistribution patterns 131 may be electrically connected to the first pad 521. The semiconductor chip 200 may be electrically connected to the conductive structure 520 through the redistribution substrate 100. A terminal pad 410 and an external connection terminal 420 may be formed on a bottom surface of the redistribution substrate 100. The external connection terminal 420 may be electrically connected to the third redistribution pattern 133 through the terminal pad 410. As a result, a semiconductor package 15 may be fabricated.

An upper hole 390 may be formed in the molding layer 300 to expose the second pad 522 of the conductive structure 520. In certain embodiments, the conductive portion 395 and the upper redistribution layer 600 may further be formed on the molding layer 300, as described with reference to FIG. 6D.

Figure 6H:
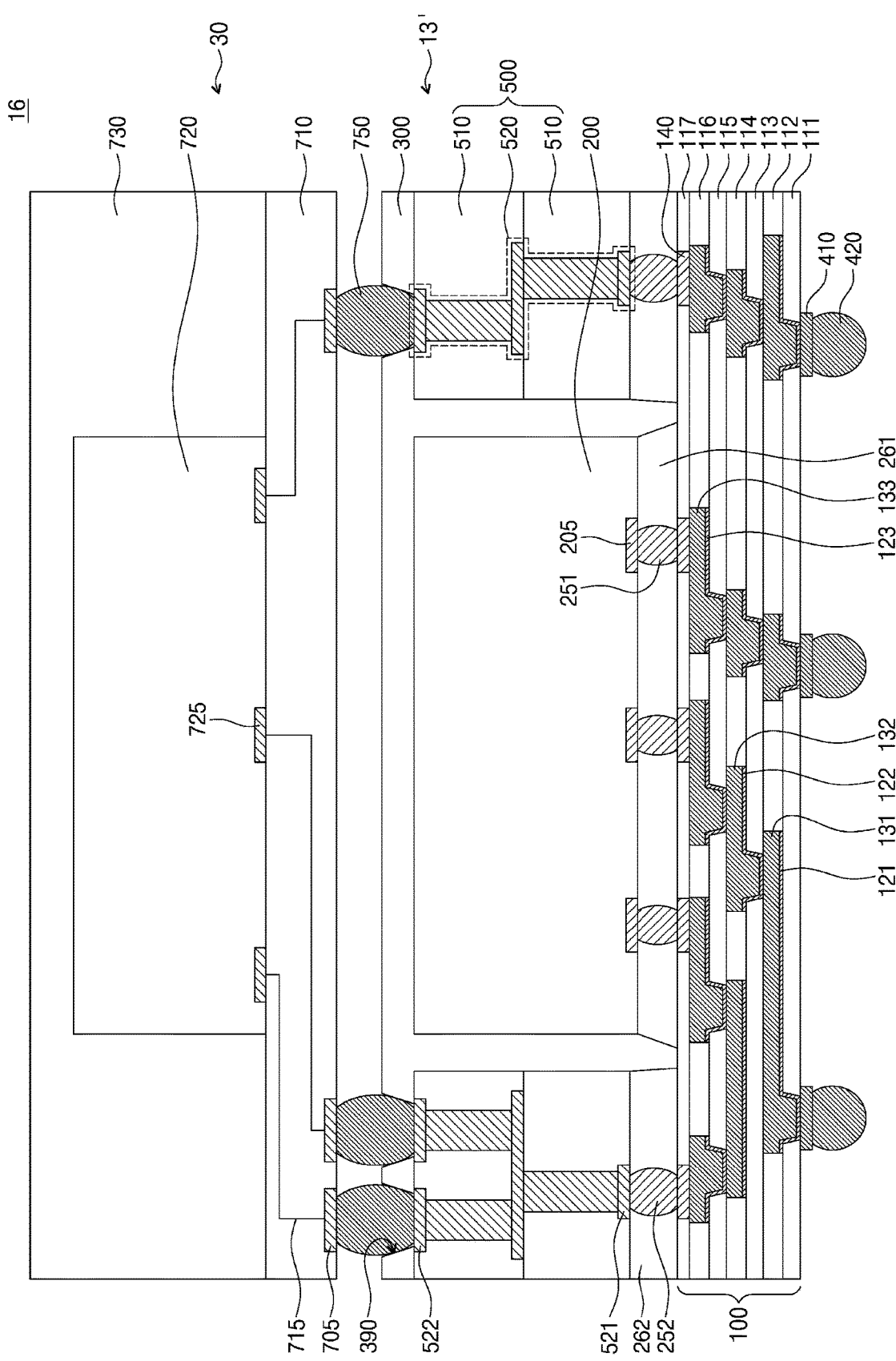
FIG. 6H is a cross-sectional view illustrating a semiconductor package according to some embodiments of the inventive concepts.

FIG. 6H is a cross-sectional view corresponding to the line I-II of FIG. 5 to illustrate a semiconductor package according to some embodiments of the inventive concepts.

Referring to FIG. 6H, a semiconductor package 16 may include a first semiconductor package 13' and a second semiconductor package 30. The semiconductor package 13 fabricated according to the embodiments of FIGS. 6A to 6C may be used as the first semiconductor package 13'. For example, the first semiconductor package 13' may include the redistribution substrate 100, the semiconductor chip 200, the connection substrate 500, and the molding layer 300.

The second semiconductor package 30 may be disposed on the first semiconductor package 13'. The second semiconductor package 30 may include a package substrate 710, an upper semiconductor chip 720, and an upper molding layer 730. The package substrate 710 may be a printed circuit board (PCB). Alternatively, the redistribution substrate 100 fabricated according to the embodiments of FIGS. 1A to 1Q or the embodiments of 4A to 4F may be used as the package substrate 710. A metal pad 705 may be disposed on a bottom surface of the package substrate 710.

The upper semiconductor chip 720 may be disposed on the package substrate 710. The upper semiconductor chip 720 may include integrated circuits, and the integrated circuits may include a memory circuit, a logic circuit, or a combination thereof. The upper semiconductor chip 720 may be electrically connected to the metal pad 705 through an interconnection line 715 disposed in the package substrate 710. The interconnection line 715 is schematically illustrated in FIG. 6H. However, a shape and arrangement of the interconnection line 715 may be variously modified. The upper molding layer 730 may be provided on the package substrate 710 to cover the upper semiconductor chip 720. The upper molding layer 730 may include an insulating polymer such as an epoxy-based polymer.

A connection terminal 750 may be provided in the upper hole 390 of the molding layer 300. The connection terminal 750 may be disposed between the second pad 522 and the metal pad 705 to electrically connect the second pad 522 and the metal pad 705. Thus, the second semiconductor package 30 may be electrically connected to the semiconductor chip 200 and the external connection terminal 420 through the connection terminal 750. Electrical connection of the second semiconductor package 30 may include electrical connection to the integrated circuits of the upper semiconductor chip 720. According to certain embodiments, since the connection substrate 500 is provided, the connection terminal 750 may be disposed freely. It should be noted that the number and arrangement of the connection terminal(s) 750 is not limited to the number and arrangement of the first pad(s) 521. Thus, the interconnection lines 715 in the package substrate 710 and the integrated circuits and interconnection lines in the upper semiconductor chip 720 may be designed freely.

In certain embodiments, the semiconductor package 15 described with reference to FIGS. 6F and 6G may be used as the first semiconductor package 13'. In certain embodiments, the semiconductor package 14 described with reference to FIGS. 6D and 6E may be used as the first semiconductor package 13'. For example, the first semiconductor package 13' may include the redistribution substrate 100, the semiconductor chip 200, the connection substrate 500, the molding layer 300, and the upper redistribution layer 600. In this case, the connection terminal 750 may be disposed between the upper conductive pad 640 and the metal pad 705. Since the upper redistribution layer 600 is provided, the connection terminal 750 may be disposed more freely. For example, the connection terminal 750 may be provided in plurality, and at least one of the connection terminals 750 may overlap with the semiconductor chip 200 when viewed in a plan view.

Figure 7B:
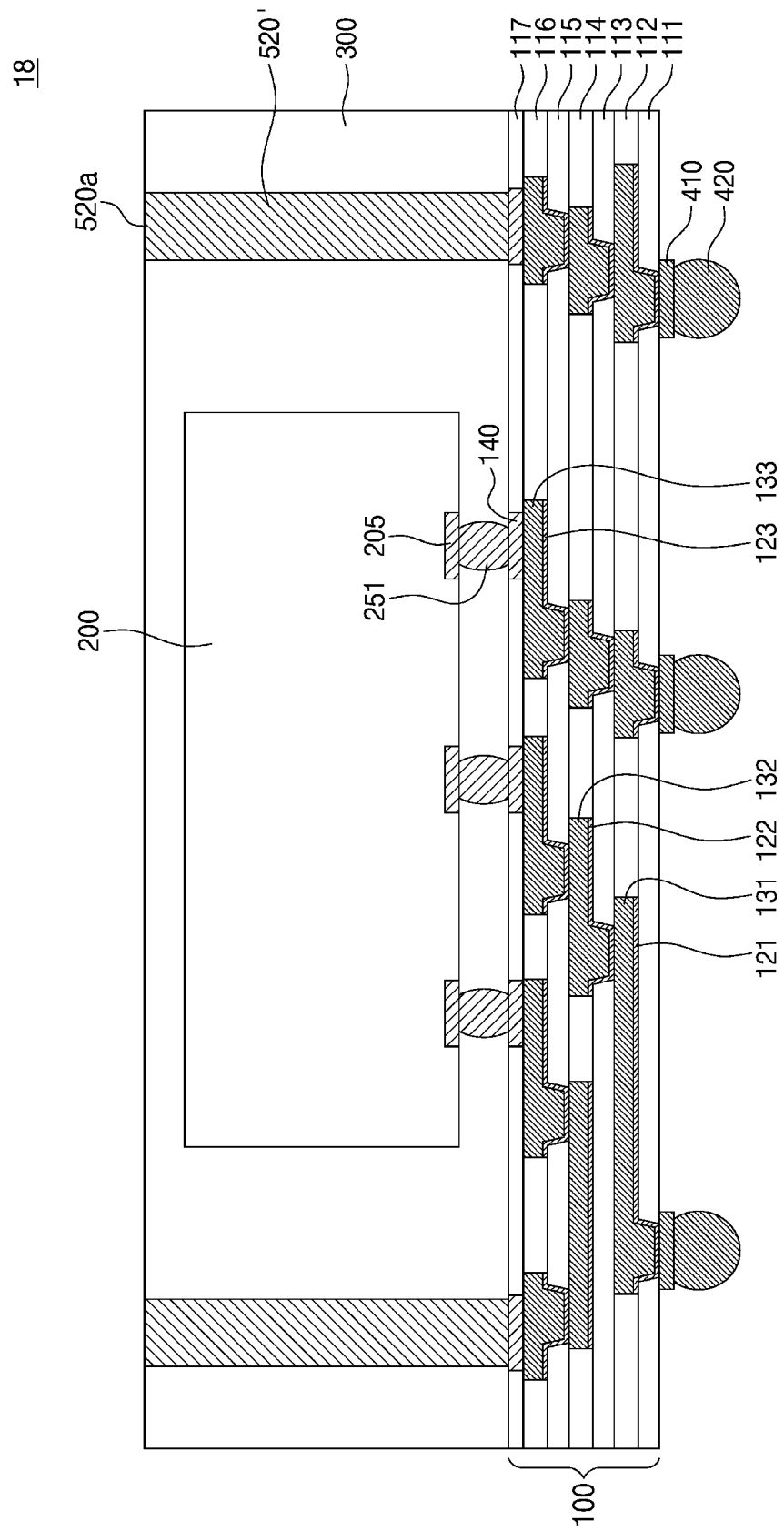

FIGS. 7A and 7B are cross-sectional views illustrating a method of fabricating a semiconductor package, according to some embodiments of the inventive concepts. Hereinafter, the descriptions to the same components and/or features as in the above embodiments will be omitted or mentioned briefly for the purpose of ease and convenience in explanation.

Referring to FIG. 7A, a carrier substrate 900 on which a redistribution substrate 100 is formed may be prepared. The redistribution substrate 100 may be formed by the method described above with reference to FIGS. 1A to 1Q. A semiconductor chip 200 may be provided on the redistribution substrate 100 in such a way that a chip pad 205 of the semiconductor chip 200 faces the redistribution substrate 100. A first connection part 251 may be formed between one of the conductive pads 140 and one of the chip pads 205. In some embodiments, an underfill pattern (not shown) may be formed between the redistribution substrate 100 and the semiconductor chip 200.

The connection substrate 500 of FIGS. 5 and 6A may not be provided. In place of the connection substrate 500, a metal pillar may be provided on the redistribution substrate 100 to form a conductive structure 520'. In other words, the conductive structure 520' may include the metal pillar. The conductive structure 520' may be spaced apart from the semiconductor chip 200. The conductive structure 520' may be electrically connected to the redistribution patterns 131, 132 and 133.

A molding layer 300 may be formed on the redistribution substrate 100 to cover the semiconductor chip 200. The molding layer 300 may cover a sidewall of the conductive structure 520' but may expose a top surface 520a of the conductive structure 520'. Thereafter, the carrier substrate 900 may be removed to expose a bottom surface of the redistribution substrate 100.

Referring to FIG. 7B, a terminal pad 410 and an external connection terminal 420 may be provided on the bottom surface of the redistribution substrate 100. The external connection terminal 420 may be electrically connected to the semiconductor chip 200 or the conductive structure 520' through the redistribution patterns 131, 132 and 133. Thus, a semiconductor package 18 may be fabricated.

Figure 7C:
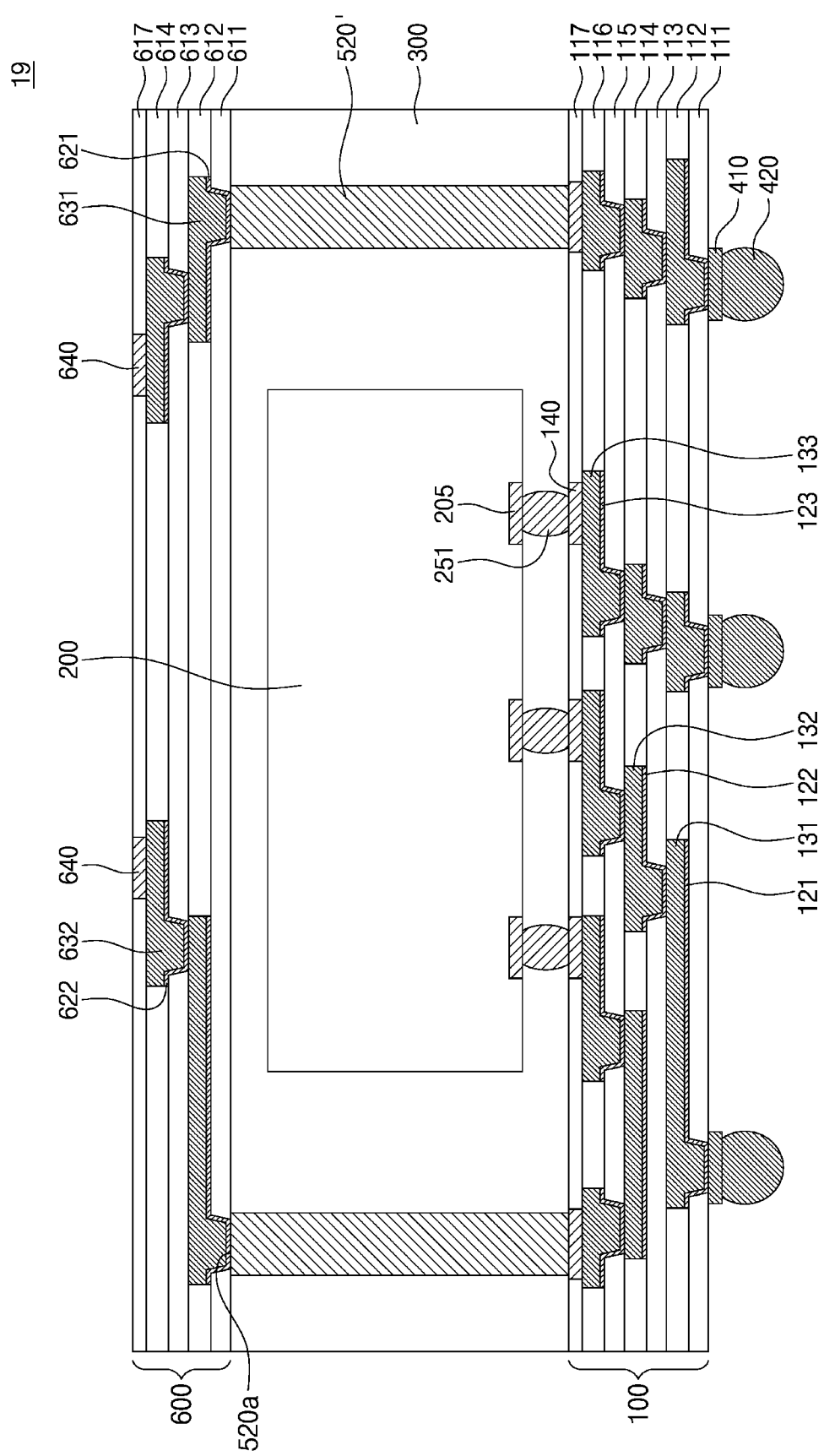
FIG. 7C is a cross-sectional view illustrating a semiconductor package according to some embodiments of the inventive concepts.

FIG. 7C is a cross-sectional view illustrating a semiconductor package according to some embodiments of the inventive concepts.

Referring to FIG. 7C, a semiconductor package 19 may include the redistribution substrate 100, the semiconductor chip 200, the molding layer 300, the conductive structure 520', and an upper redistribution layer 600. The redistribution substrate 100, the semiconductor chip 200, the molding layer 300, and the conductive structure 520' may be fabricated by the method described above with reference to FIGS. 7A and 7B. The upper redistribution layer 600 may be formed by substantially the same method as described with reference to FIG. 6D, and may be referred to as a redistribution substrate as well. However, the first upper insulating layer 611 may have an upper opening, and the upper opening may expose the top surface 520a of the conductive structure 520'. The first upper redistribution pattern 631 may be provided in the upper opening. The first upper redistribution pattern 631 may contact the top surface 520a of the conductive structure 520' so as to be electrically connected to the conductive structure 520'. The upper protective layer 617 may be formed on the fourth upper insulating layer 614 to cover at least a portion of the second upper redistribution pattern 632. The upper conductive pad 640 may be formed on the second upper redistribution pattern 632. The upper conductive pad 640 may be connected to the second upper redistribution pattern 632.

Figure 7D:
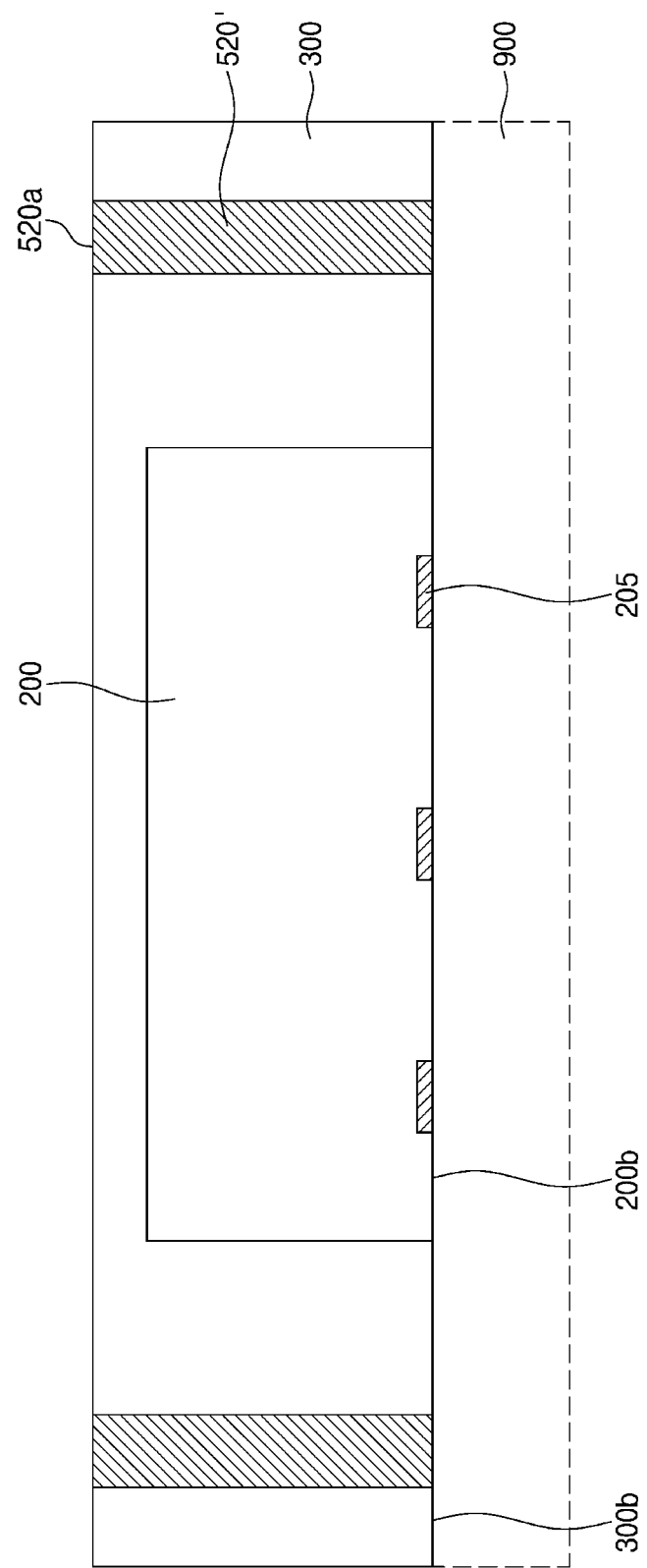
FIGS. 7D and 7E are cross-sectional views illustrating a method of fabricating a semiconductor package, according to some embodiments of the inventive concepts.
Figure 7E:
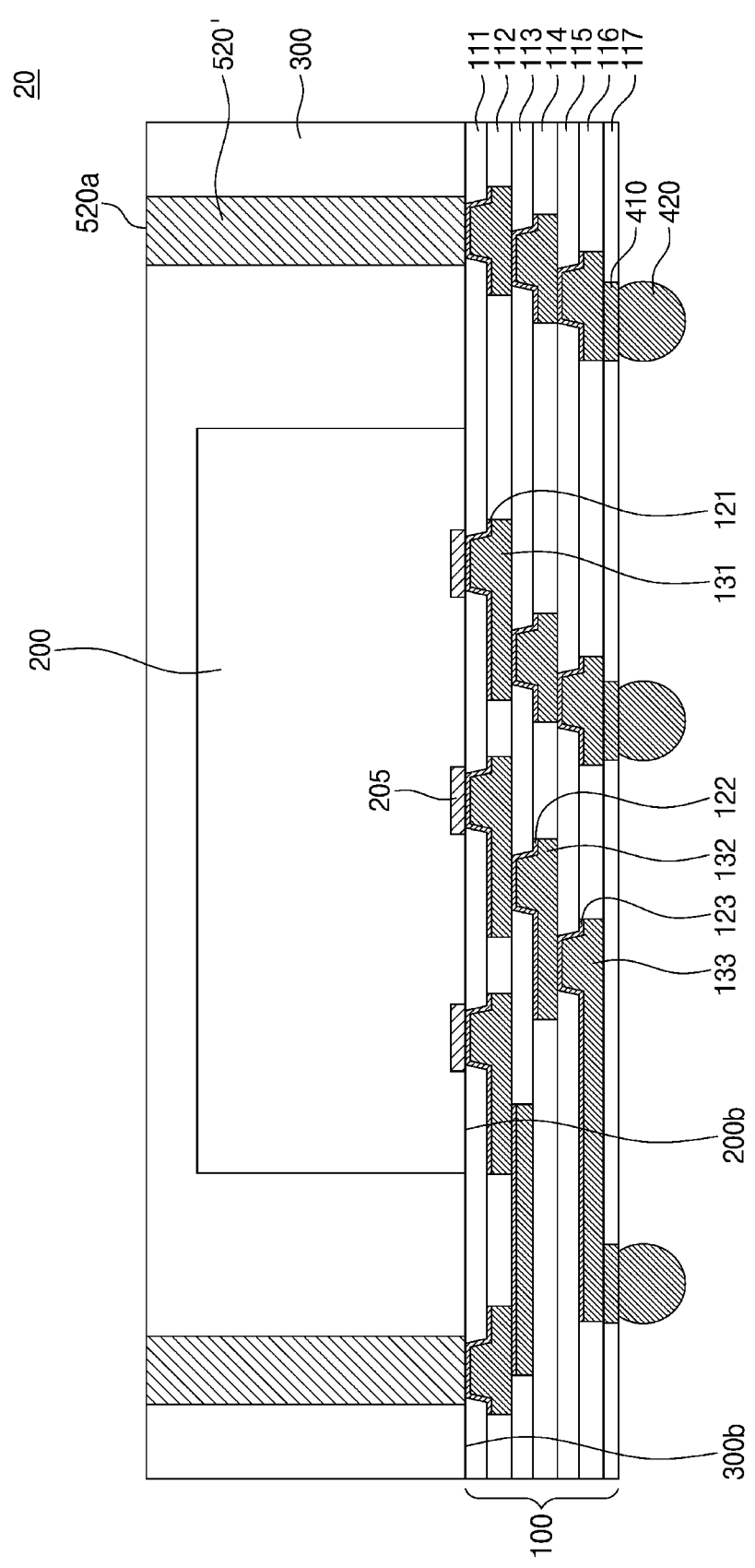

FIGS. 7D and 7E are cross-sectional views illustrating a method of fabricating a semiconductor package, according to some embodiments of the inventive concepts.

Referring to FIG. 7D, a semiconductor chip 200 may be provided on a carrier substrate 900. At this time, a chip pad 205 of the semiconductor chip 200 may face the carrier substrate 900. A metal pillar may be disposed on the carrier substrate 900 to form a conductive structure 520'. A molding layer 300 may be formed on the carrier substrate 900 to cover the semiconductor chip 200. The molding layer 300 may cover a sidewall of the conductive structure 520' but may expose a top surface 520a of the conductive structure 520'.

Thereafter, the carrier substrate 900 may be removed to expose a surface 200b of the semiconductor chip 200, a surface 300b of the molding layer 300, and a bottom surface of the conductive structure 520'.

Referring to FIG. 7E, a first insulating layer 111, a first seed layer 121, a first redistribution pattern 131, a second insulating layer 112, a third insulating layer 113, a second seed layer 122, a second redistribution pattern 132, a fourth insulating layer 114, a fifth insulating layer 115, a third seed layer 123, a third redistribution pattern 133, and a sixth insulating layer 116 may be sequentially formed on the surface 200b of the semiconductor chip 200, the surface 300b of the molding layer 300, and the bottom surface of the conductive structure 520' to fabricate a redistribution substrate 100. The redistribution substrate 100 may be fabricated by substantially the same method as described above with reference to FIGS. 4A to 4F. One of the first redistribution patterns 131 may be connected to the chip pad 205, and another of the first redistribution patterns 131 may be connected to the conductive structure 520'. The semiconductor chip 200 may be electrically connected to the conductive structure 520' through at least one of the redistribution patterns 131, 132 and 133.

A terminal pad 410 and an external connection terminal 420 may be provided on the bottom surface of the redistribution substrate 100 so as to be electrically connected to one of the third redistribution patterns 133. For example, one of the external connection terminals 420 may be electrically connected to the semiconductor chip 200 through the redistribution patterns 131, 132 and 133, and another of the external connection terminals 420 may be electrically connected to the conductive structure 520' through the redistribution patterns 131, 132 and 133. Thus, a semiconductor package 20 may be fabricated. In certain embodiments, the upper redistribution layer 600 described with reference to FIG. 7C may be formed on the top surface of the molding layer 300.

FIG. 7F is a cross-sectional view illustrating a semiconductor package according to some embodiments of the inventive concepts.

Referring to FIG. 7F, a semiconductor package 21 may include a first semiconductor package 19' and a second semiconductor package 30. The semiconductor package 19 described with reference to FIG. 7C may be used as the first semiconductor package 19'. For example, the first semiconductor package 19' may include the redistribution substrate 100, the semiconductor chip 200, the molding layer 300, the conductive structure 520', and the upper redistribution layer 600.

The second semiconductor package 30 may be disposed on the first semiconductor package 19'. The second semiconductor package 30 may be substantially the same as the second semiconductor package 30 of FIG. 6G. For example, the second semiconductor package 30 may include the package substrate 710, the upper semiconductor chip 720, and the upper molding layer 730.

The connection terminal 750 may be disposed between the upper conductive pad 640 and the metal pad 705 to electrically connect the upper conductive pad 640 and the metal pad 705. The upper semiconductor chip 720 may be electrically connected to the redistribution substrate 100 through the connection terminal 750, the upper redistribution patterns 631 and 632, and the conductive structure 520'.

In certain embodiments, the semiconductor package 18 fabricated in FIGS. 7A and 7B or the semiconductor package 20 fabricated in FIGS. 7D and 7E may be used as the first semiconductor package 19'. In this case, the connection terminal 750 may be disposed between the conductive structure 520' and the metal pad 705.

According to the embodiments of the inventive concepts, the surfaces of the first redistribution patterns may be planarized and thus may be disposed at substantially the same or similar levels. The second redistribution patterns may be formed on the surfaces of the first redistribution patterns. Thus, the patterning accuracy may be improved in the process of forming the second redistribution patterns. As a result, a distance between the second redistribution patterns may be reduced, and the second redistribution patterns may have a fine pitch. The redistribution patterns may be formed in the guide openings defined by the resist pattern. Thus, each of the redistribution patterns may have a relatively uniform width.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the invention is to be determined by the broadest permissible interpretation of the following claims and their equivalents, and shall not be restricted or limited by the foregoing description.

What is claimed is:

1. A method of fabricating a semiconductor package, the method comprising:
   providing a semiconductor chip;
   forming a redistribution substrate; and
   fabricating a package including the semiconductor chip disposed on the redistribution substrate,
   wherein the forming of the redistribution substrate comprises:
   forming a first insulating layer on a substrate, the first insulating layer having a first opening formed therein;
   forming an integrally formed first redistribution pattern in the first opening and on the first insulating layer, so that a first portion of the first redistribution pattern is in the first opening, and a second portion of the first redistribution pattern is on the first insulating layer such that a part of the first insulating layer is between the second portion of the first redistribution pattern and the substrate;
   forming a second insulating layer on the first insulating layer to cover the first redistribution pattern;
   performing a planarization process on the second insulating layer to expose the first redistribution pattern; and
   disposing the semiconductor chip to overlap the integrally formed first redistribution pattern in a plan view.

2. The method of claim 1, wherein the performing of the planarization process comprises:
   removing the second insulating layer disposed on the first redistribution pattern to expose a surface of the first redistribution pattern; and
   planarizing the exposed surface of the first redistribution pattern.

3. The method of claim 2, wherein the forming of the redistribution substrate further comprises: forming a first seed layer on a sidewall and a bottom surface of the first opening.

4. The method of claim 3, wherein, after the forming the second insulating layer, the first seed layer does not extend between the first redistribution pattern and the second insulating layer.

5. The method of claim 2, wherein the forming of the redistribution substrate further comprises: forming a resist pattern on the first insulating layer, the resist pattern having a first guide opening, and wherein the first redistribution pattern is formed in the first guide opening.

6. The method of claim 5, wherein the second portion of the first redistribution pattern is formed in the first guide opening and includes sidewalls that are vertical compared to tapered sidewalls of the first portion of the first redistribution pattern.

7. The method of claim 1, wherein the forming of the redistribution substrate further comprises:
   forming a third insulating layer having a second opening on the first redistribution pattern, the second opening exposing the first redistribution pattern;
   forming a second redistribution pattern in the second opening and on the third insulating layer;
   forming a fourth insulating layer covering the second redistribution pattern on the third insulating layer; and
   performing a planarization process on the fourth insulating layer,
   wherein the performing of the planarization process on the fourth insulating layer comprises:
   removing the fourth insulating layer disposed on a surface of the second redistribution pattern; and
   planarizing the surface of the second redistribution pattern.

8. A method of fabricating a semiconductor package, the method comprising:
   forming a redistribution substrate configured to be electrically connected to a chip pad of a semiconductor chip,
   wherein the forming of the redistribution substrate comprises:
   forming a first insulating layer on a substrate, the first insulating layer having an opening formed therein;
   forming a resist pattern on the first insulating layer, the resist pattern having a guide opening formed therein;
   forming an integrally formed first redistribution pattern in the opening and the guide opening;
   planarizing a surface of the first redistribution pattern;
   forming a second redistribution pattern above the guide opening to be adjacent to and electrically connected to the first redistribution pattern, the second redistribution pattern connected to the first redistribution pattern at a top surface of the first redistribution pattern;
   forming a conductive terminal below the first redistribution pattern to be adjacent to and electrically connected to the first redistribution pattern, the conductive terminal connected to the first redistribution pattern at a bottom surface of the first redistribution pattern,
   wherein the top surface of the first redistribution pattern where the first redistribution pattern connects to the second redistribution pattern does not vertically overlap with the bottom surface of the first redistribution pattern where the first redistribution pattern connects to the conductive terminal.

9. The method of claim 8, wherein the forming of the redistribution substrate further comprises: forming a first seed layer in the opening and on the first insulating layer, and wherein the resist pattern is formed on the first seed layer.

10. The method of claim 9, wherein the forming of the redistribution substrate further comprises:
    removing the resist pattern to expose the first seed layer; and
    removing the first seed layer exposed by the first redistribution pattern.

11. The method of claim 8, wherein the forming of the first redistribution substrate further comprises:
    forming a second insulating layer on the first insulating layer to cover the first redistribution pattern; and
    planarizing the second insulating layer to expose the surface of the first redistribution pattern.

12. The method of claim 8, wherein the planarizing of the surface of the first redistribution pattern is performed by a chemical mechanical polishing (CMP) method or a surface cutting method.

13. The method of claim 8, further comprising:
    mounting the semiconductor chip on the redistribution substrate; and
    forming a molding layer covering the semiconductor chip on the redistribution substrate, wherein the redistribution substrate extends onto a bottom surface of the molding layer.

14. The method of claim 13, wherein the substrate includes a carrier substrate, the method further comprising:

removing the carrier substrate to expose a bottom surface of the first insulating layer, wherein the semiconductor chip and the molding layer are disposed on a surface of the redistribution substrate opposite to the exposed bottom surface of the first insulating layer.

15. The method of claim 8, wherein the semiconductor chip comprises: a semiconductor substrate; integrated circuits on the semiconductor substrate; an interconnection line connected to the integrated circuits; and the chip pad connected to the interconnection line, wherein the substrate includes the semiconductor substrate such that forming a first insulating layer on the substrate includes forming the first insulating layer on the semiconductor substrate of the semiconductor chip, and wherein the opening exposes the chip pad.

16. The method of claim 8, wherein a first portion of the first redistribution pattern is in the opening, and a second portion of the first redistribution pattern is in the guide opening and on the first insulating layer, and wherein the second portion of the first redistribution pattern includes sidewalls that are vertical compared to tapered sidewalls of the first portion of the first redistribution pattern.

17. The method of claim 1, wherein the first redistribution pattern redistributes a signal in a horizontal direction parallel to a bottom surface of the first insulating layer.

18. A method of fabricating a semiconductor package, the method comprising:

providing a semiconductor chip;

forming a redistribution substrate;

fabricating a package including the semiconductor chip disposed on the redistribution substrate; and forming a molding layer covering a top surface of the semiconductor chip on the redistribution substrate, wherein the forming of the redistribution substrate comprises:

forming a first insulating layer having a first opening on a substrate;

forming a first redistribution pattern in the first opening and on the first insulating layer; and planarizing a surface of the first redistribution pattern, wherein the redistribution substrate is disposed on a bottom surface of the semiconductor chip and a bottom surface of the molding layer, and wherein the first redistribution pattern is spaced apart from the molding layer.

19. The method of claim 18, wherein the semiconductor chip overlaps the first redistribution pattern in a plan view.

* * * * *